(12) United States Patent
Maejima et al.

(10) Patent No.: US 7,800,935 B2
(45) Date of Patent: Sep. 21, 2010

(54) RESISTANCE CHANGE MEMORY DEVICE

(75) Inventors: Hiroshi Maejima, Chigasaki (JP); Katsuaki Isobe, Yokohama (JP); Naoya Tokiwa, Fujisawa (JP); Satoru Takase, Yokohama (JP); Yasuyuki Fukuda, Kamakura (JP); Hideo Mukai, Tokyo (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 12/252,675

(22) Filed: Oct. 16, 2008

(65) Prior Publication Data
US 2009/0109728 A1     Apr. 30, 2009

(30) Foreign Application Priority Data
Oct. 17, 2007    (JP) .............................. 2007-269973

(51) Int. Cl.
    *G11C 11/00*    (2006.01)
(52) U.S. Cl. .................... 365/148; 365/163; 365/174
(58) Field of Classification Search ................. 365/148, 365/189.11, 174, 163
    See application file for complete search history.

(56) References Cited

U.S. PATENT DOCUMENTS

| | | | |
|---|---|---|---|
| 6,813,177 B2 | 11/2004 | Lowrey et al. | |
| 7,701,749 B2 * | 4/2010 | Jeong et al. ................. | 365/148 |
| 7,715,220 B2 * | 5/2010 | Tsushima et al. ........... | 365/148 |
| 2006/0166455 A1 | 7/2006 | Gordon et al. | |
| 2006/0203541 A1 | 9/2006 | Toda | |
| 2007/0274121 A1 | 11/2007 | Lung et al. | |
| 2008/0048167 A1 | 2/2008 | Kostylev et al. | |

OTHER PUBLICATIONS

Y. Hosoi, et al., "High Speed Unipolar Switching Resistance RAM (RRAM) Technology", IEEE IEDM 2006 Technical Digest, 4 pages.
U.S. Appl. No. 12/580,795, filed Oct. 16, 2009, Mukai, et al.
U.S. Appl. No. 12/370,111, filed Feb. 12, 2009, Maejima, et al.

* cited by examiner

*Primary Examiner*—Richard Elms
*Assistant Examiner*—Hien N Nguyen
(74) *Attorney, Agent, or Firm*—Oblon, Spivak, McClelland, Maier & Neustadt, L.L.P.

(57) ABSTRACT

A resistance change memory device including memory cells arranged, the memory cell having a stable state with a high resistance value and storing in a non-volatile manner such multi-level data that at least three resistance values, R0, R1 and R2 (R0<R1<R2) are selectively set, wherein resistance gaps $\Delta R1(=R1-R0)$ and $\Delta R2(=R2-R1)$ are set to satisfy the relationship of $\Delta R1 > \Delta R2$.

14 Claims, 18 Drawing Sheets

ΔR1 > ΔR2 and ΔR3 > ΔR2

ΔR1' > ΔR2' and ΔR3' > ΔR2'

ΔR0" > ΔR1" and ΔR2" > ΔR1"

RESISTANCE CHANGE MEMORY DEVICE

CROSS-REFERENCE TO RELATED APPLICATION

This application is based on and claims the benefit of priority from the prior Japanese Patent Application No. 2007-269973, filed on Oct. 17, 2007, the entire contents of which are incorporated herein by reference.

BACKGROUND OF THE INVENTION

1. Field of the Invention

This invention relates to a resistance change memory device, specifically relates to data retention thereof in case a multi-level data storage scheme is adapted.

2. Description of the Related Art

Recently, it is noticed that a resistance change memory succeeds to a conventional flash memory. The "resistance change memory" described here includes not only a narrow-sensed resistance change memory (ReRAM: Resistance RAM), which has a recoding layer formed of a transition metal oxide for storing a resistance value state in a non-volatile manner, but also a phase change memory (PCRAM: Phase Change RAM), which uses a crystalline state (i.e., conductor) and an amorphous state (i.e., insulator) as data.

It is well known that there are two kinds of operation modes in ReRAMs as follows. One is referred to as a bipolar type of ReRAM, in which it is required of the applied voltage to be exchanged in polarity for switching the high resistance state and the low resistance state. The other is a unipolar type of ReRAM, in which the high resistance state and the low resistance state are settable by controlling the applied voltage value and applying time (for example, Y. Hosoi et al, "High Speed Unipolar Switching Resistance RAM (RRAM) Technology" IEEE International Electron Devices Meeting 2006 Technical Digest p. 793-796).

It is desirable to use a unipolar type of ReRAM to achieve a highly integrated memory cell array. In case of a unipolar type, stacking variable resistance elements and diodes at the cross points of bit lines and word lines, a cell array may be constituted without transistors. In addition, three-dimensionally stacking the cell arrays, it is possible to achieve a large capacitive memory (for example, see JP 2006-514393A (PCT/JP2003/003257)).

The data retention will be determined by the stability of the resistance state. For example, a high resistance state is defined as a reset state (i.e., thermally stabilized state) while a low resistance state is defined as a set state, and it becomes problematic that the set state easily shifts to the reset state side. That is, when a number of read operations are executed, the low resistance value of the set state gradually shifts toward the high resistance value side.

Note here, there is also such a case that the low resistance state is a stable state. In this case, the high resistance state easily shifts to the low resistance state. For example, in a PCRAM, the data retention on the high resistance state side usually becomes problematic.

The above-described data retention becomes a large problem specifically when a multi-level data storage scheme is adapted to the memory.

SUMMARY OF THE INVENTION

According to an aspect of the present invention, there is provided a resistance change memory device including memory cells arranged, the memory cell having a stable state with a high resistance value and storing in a non-volatile manner such multi-level data that at least three resistance values, R0, R1 and R2 (R0<R1<R2) are selectively set, wherein resistance gaps $\Delta R1(=R1-R0)$ and $\Delta R2(=R2-R1)$ are set to satisfy the relationship of $\Delta R1 > \Delta R2$.

According to another aspect of the present invention, there is provided a resistance change memory device including memory cells arranged, wherein the memory cell is reset at the lowest resistance value R0, and resistance values R1, R2 and R3 (R0<R1<R2<R3) are selectively set in it for storing four-level data in a non-volatile manner, the highest resistance value R3 being unstable, and wherein resistance gaps $\Delta R1(=R1-R0)$, $\Delta R2(=R2-R1)$ and $\Delta R3(=R3-R2)$ are set to satisfy the relationship of $\Delta R3 > \Delta R2 \geq \Delta R1$.

DETAILED DESCRIPTION OF THE EMBODIMENTS

Illustrative embodiments of this invention will be explained with reference to the accompanying drawings below.

Figure 1:
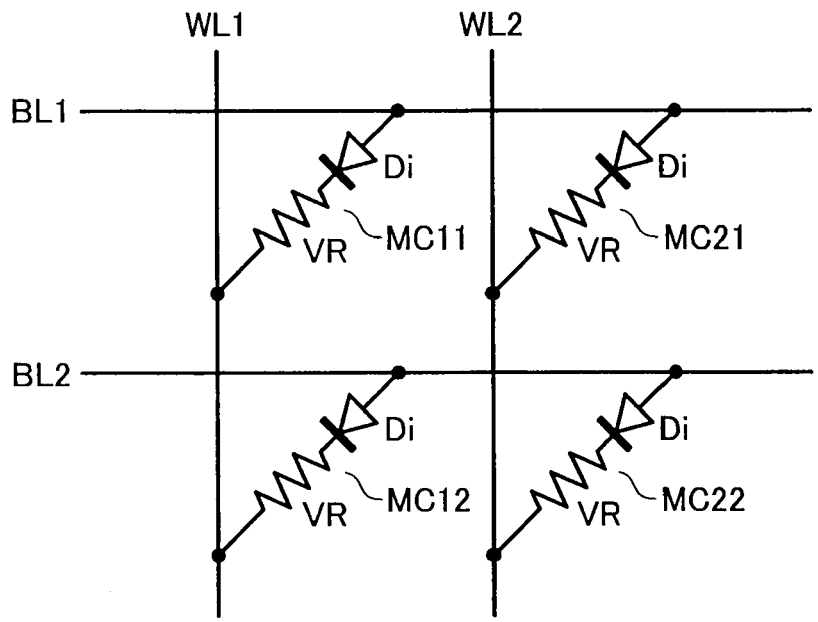
FIG. 1 shows an equivalent circuit of a ReRAM cell array.

FIG. 1 shows an equivalent circuit of a cell array of a resistance change memory (ReRAM) in accordance with an embodiment. Word lines WLi (WL1, WL2, ...) and bit lines BLj (BL1, BL2, ...) are formed to cross each other, and memory cells MCij (MC11, MC12, ..., MC21, MC22, ...) are disposed at the respective cross points.

Memory cell MC is formed of variable resistance element VR and diode Di connected in series. Variable resistance element VR stores a resistance value as data in a non-volatile manner, which is electrically or thermally settable. Although the detailed layout is not shown here, for example, diode Di and variable resistance element VR are stacked on word lines WL, and bit lines BL are disposed thereabove in perpendicular to the word lines.

Figure 2:
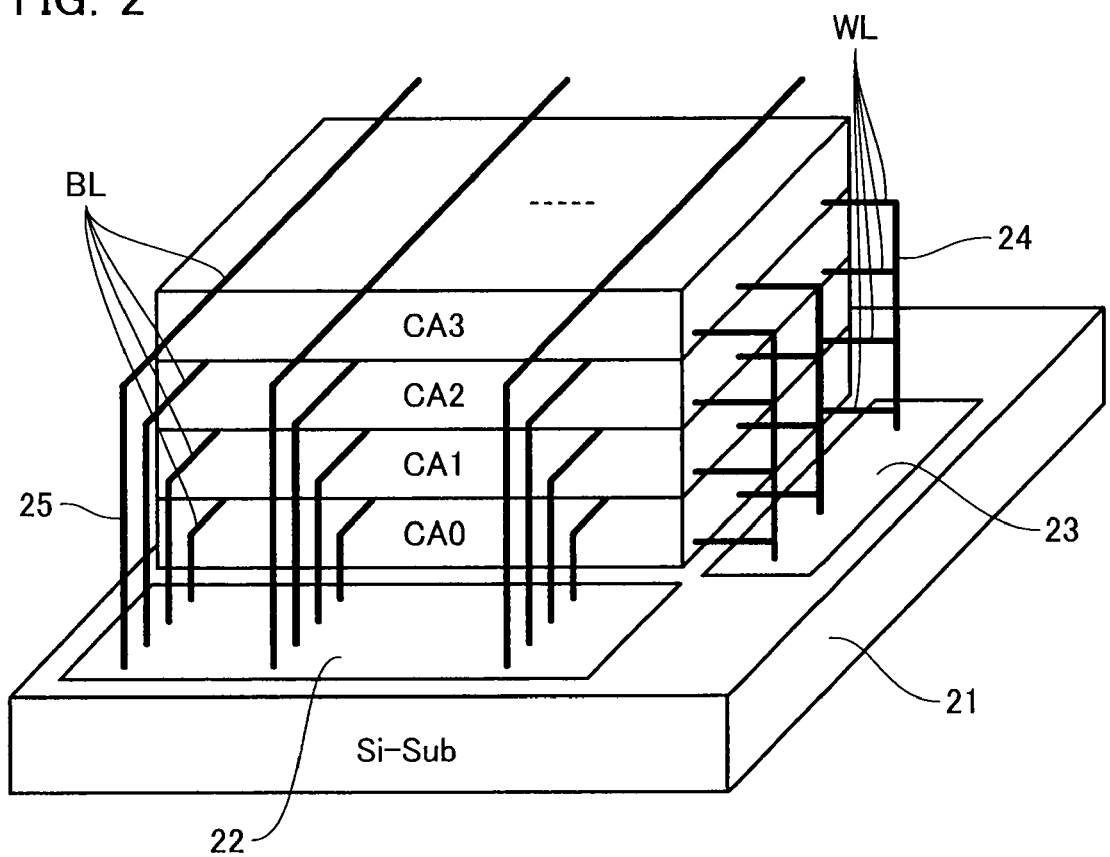
FIG. 2 shows a schematic configuration of a three dimensional ReRAM cell array.

To achieve a large capacitive ReRAM, as shown in FIG. 2, multiple cell arrays are stacked to constitute a three dimensional (3D) cell array. FIG. 2 shows an example, in which four cell arrays CA0-CA3 are stacked on a silicon substrate 21. Word lines WL of the respective layers are coupled to common via wirings 24 to be connected with word line driver circuit 23 formed on the substrate 21. Bit lines BL of the respective layers are coupled independently to via wirings 25, respectively, to be connected with bit line select circuit/sense amplifier circuit 22.

Figure 3:
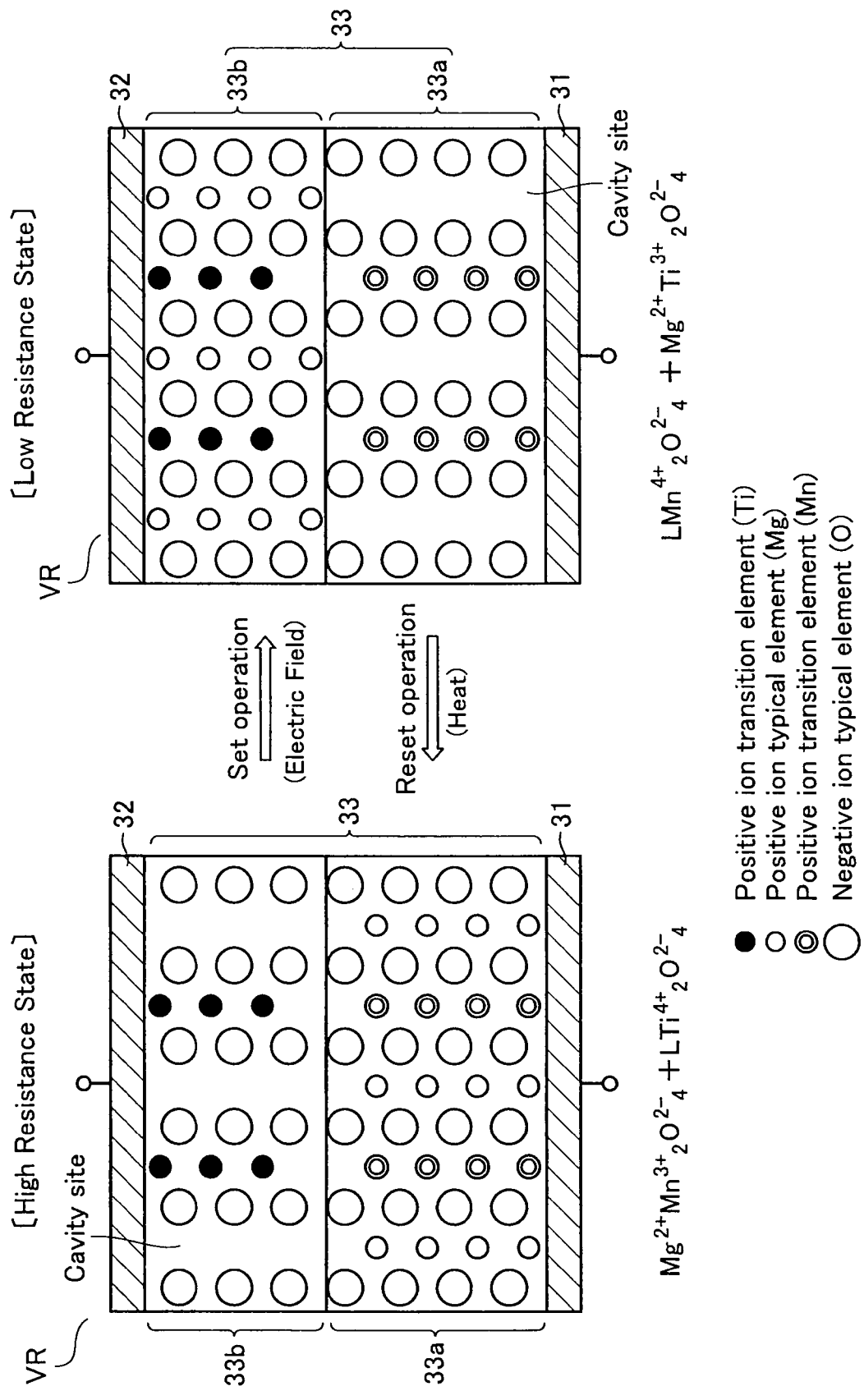
FIG. 3 shows schematic cross-sectional views of a variable resistance element of a ReRAM cell and set/reset operation principle thereof.

FIG. 3 shows a schematic structure of a variable resistance element VR and data storing modes thereof. Variable resistance element VR is formed of a recording layer 33, which is sandwiched between electrodes 31 and 32. The resistance value of the recording layer 33 is variably settable. Here is shown such an example that the recording layer 33 is formed of first and second metal oxide layers 33a and 33b stacked.

Explaining in detail, the first metal oxide 33a is a Mn spinnel containing Mg ($MgMn_2O_4$) while the second metal oxide 33b is a Ti spinnel including cavity site ($LTi_2O_4$), where L shows cavity site.

Shown on the left side in FIG. 3 is a thermally stable high resistance state (i.e., reset state). Apply voltage between electrodes 31 and 32 in this state on the condition that electrode 31 becomes positive, and Mg ions in the first metal oxide 33a are moved into the second metal oxide 33b and trapped in the cavity site, so that the element is set in a low resistance state (set operation). Apply a certain voltage to the element stayed in the low resistance state to generate Joule's heat during a certain time, and the element is restored to the initial high resistance state (reset operation).

Figure 4:
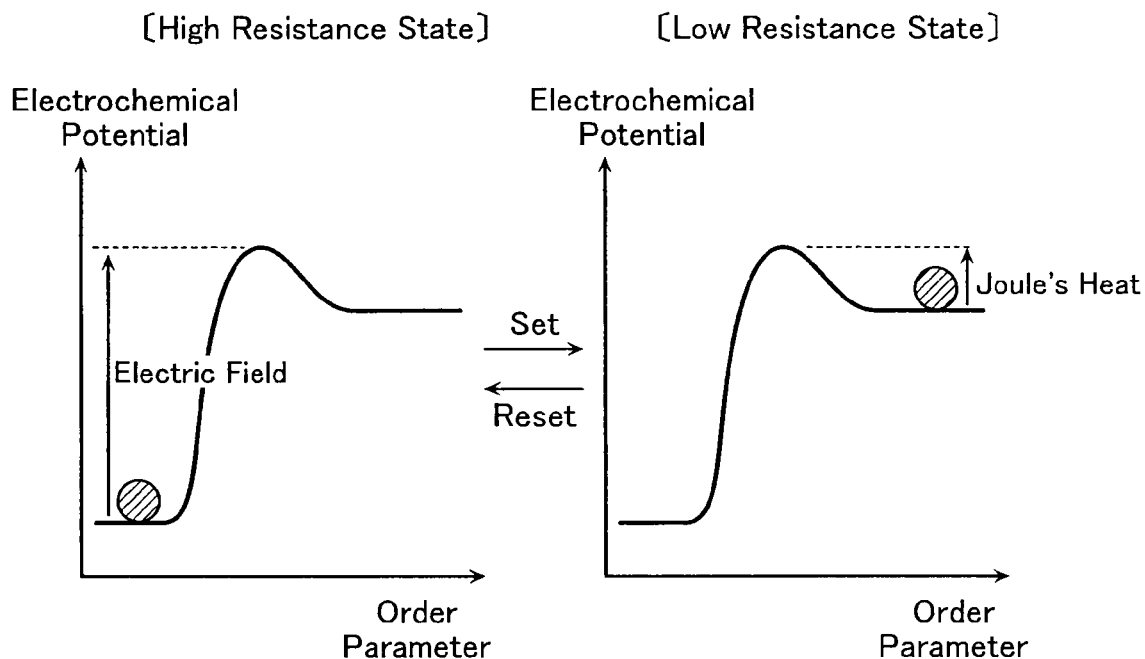
FIG. 4 shows schematic potential states of a high resistance state and a low resistance state.

FIG. 4 shows schematically the electrochemical potential distributions in the high resistance state and low resistance state described above. That is, in this example, the set operation and reset operation, i.e., data write and erase, are performed as a voltage (electric field) process and a thermal process, respectively. The high resistance state with a low electrochemical potential is a stable state. The low resistance state with a low potential barrier is relatively unstable, and this determines the data retention property.

Figure 5:
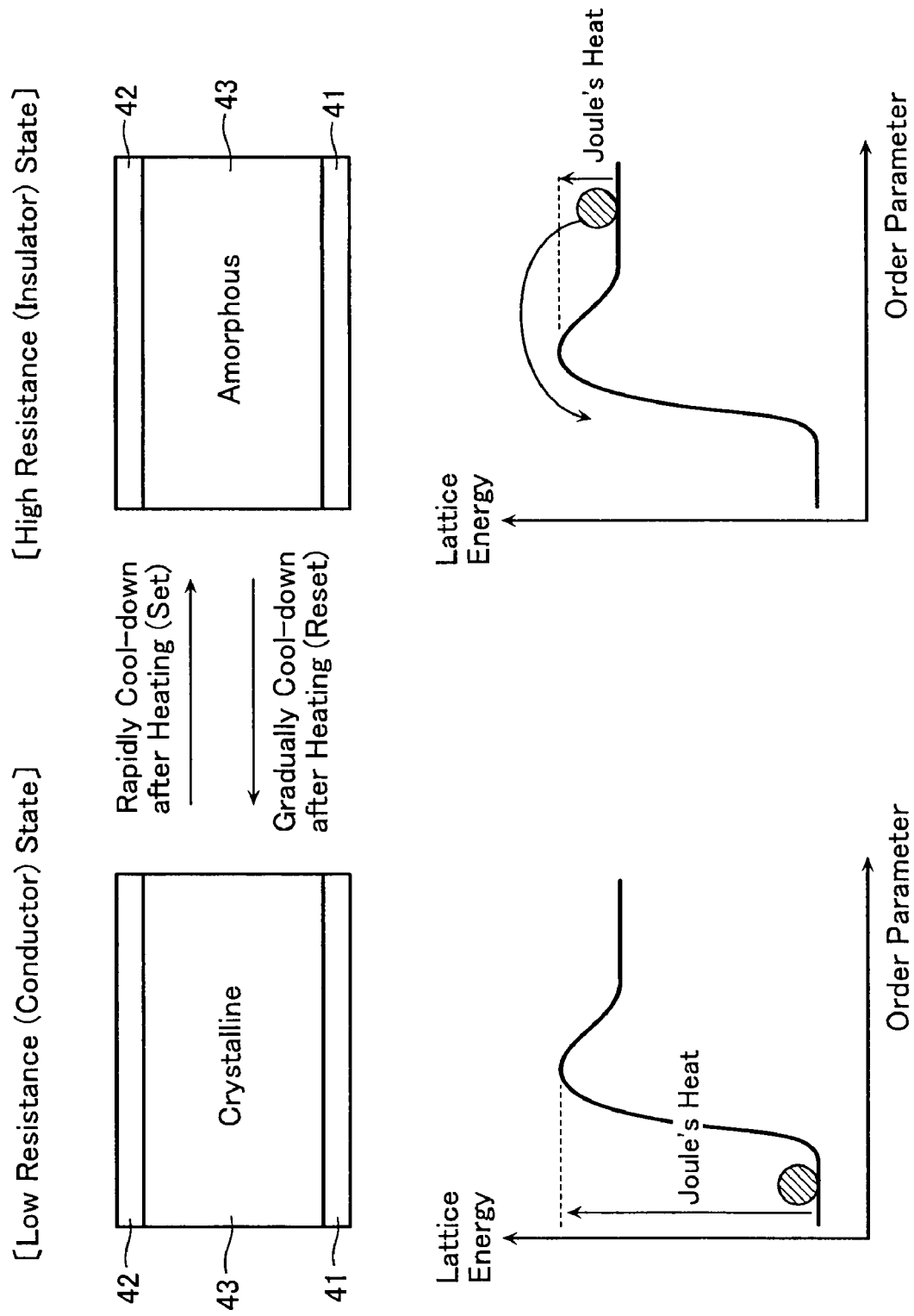
FIG. 5 shows schematic cross-sectional views of a variable resistance element of a PCRAM and set/reset operation principle thereof.

FIG. 5 shows a device structure of a PCRAM and set and reset operations thereof. A memory cell (variable resistance element) of the PCRAM is formed of chalcogenide layer 43 as a recording layer sandwiched by electrodes 41 and 42. While the recording layer is in a crystalline state, the element is in a low resistance state (conductor).

Heating the element stayed in the low resistance state by Joule's heat, and then rapidly cooling down it, the recording layer becomes amorphous to be in a high resistance (insulator) state (set operation). By contrast, heating the element stayed in the high resistance state, and then gradually cooling down it, the recording layer becomes crystalline, and is restored in the low resistance state (reset operation). In this example, the reset state is a stable state while the set state is an unstable state with a low lattice energy barrier.

That is, the relationship between the set/reset and resistance value in the PCRAM is reversed to that in the ReRAM. In this PCRAM, the high resistance state is relatively unstable, and it determines the data retention property.

Figure 6:
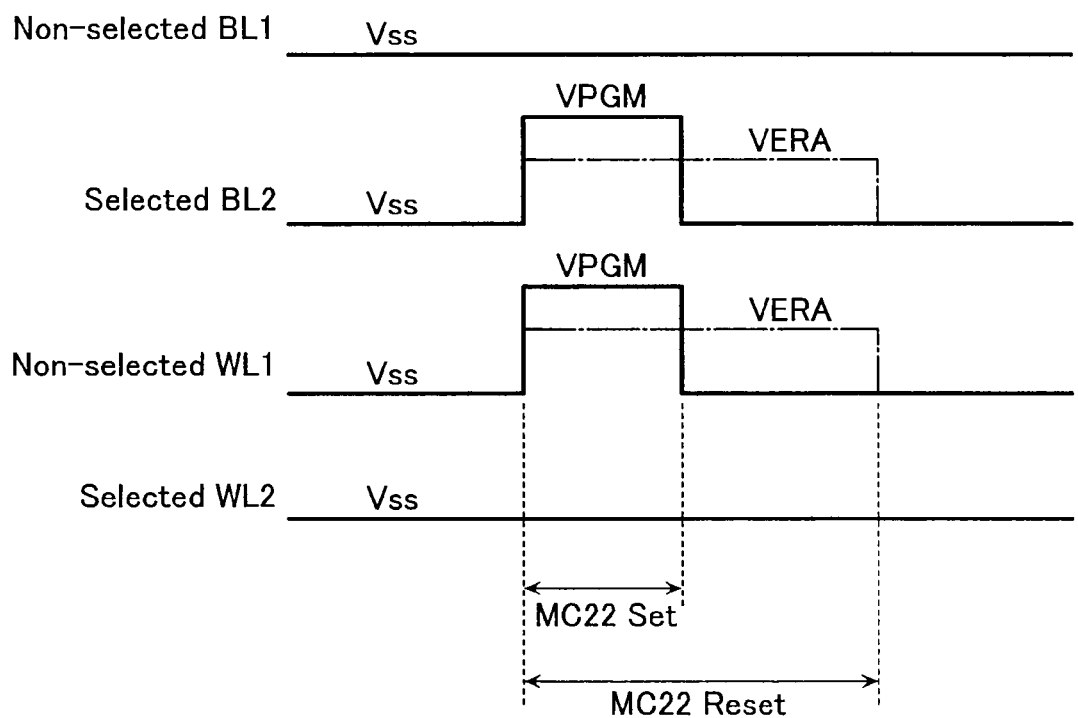
FIG. 6 shows voltage waveforms of set and reset operations of the ReRAM.

Next, with reference to the cell array shown in FIG. 1, the basic operation of data write (set) and erase (reset) will be explained below. FIG. 6 shows operation waveforms in such a case that memory cell MC22 is selected by bit line BL2 and word line WL2 to be set or reset.

At a set time, while non-selected bit line BL1 is set at Vss, the selected bit line BL2 is applied with setting voltage VPGM. Assuming that the voltage drop of the forward-biased diode Di is Vd, and voltage to be applied to the variable resistance element is Vp, the setting voltage VPGM is set as follows: VPGM=Vd+Vp.

While the setting voltage VPGM is applied to the selected bit line BL2, non-selected word line WL1 is applied simultaneously with the voltage VPGM as a blocking voltage. The selected word line WL2 is kept at Vss.

As a result, only in the selected memory cell MC22 selected by bit line BL2 and word line WL2, the variable resistance element VR is applied with necessary setting voltage Vp, and the set operation (i.e., write operation) in the electric field mode is performed.

At the reset time, voltage and applying time thereof are different from those at the set time. That is, the selected bit line BL2 is applied with resetting voltage VERA set lower than the setting voltage VPGM. Assuming that the voltage to be applied to the variable resistance element is Vrs (<Vp), the resetting voltage VERA is set as follows: VERA=Vd+Vrs. As similar to the set operation, non-selected word line WL1 is applied with the voltage VERA as a blocking voltage, and the selected word line WL2 is kept at Vss.

The application time of the resetting voltage VERA is made to be longer than that of the setting voltage VPGM. As a result, the reset operation (erase operation) of the selected cell MC2 is performed through the thermal process based on the Joule's heat generated in the variable resistance element VR.

So far, the basic set and reset operations have been explained. In this embodiment, a multi-level data storage scheme is used. In other words, three or more resistance values are used as data. In this case, what is material is to set the respective resistance values while noticing an unstable resistance state (i.e., resistance value easily shifts) in the multiple resistance values. Four-level data storage scheme will be explained below.

Figure 7:
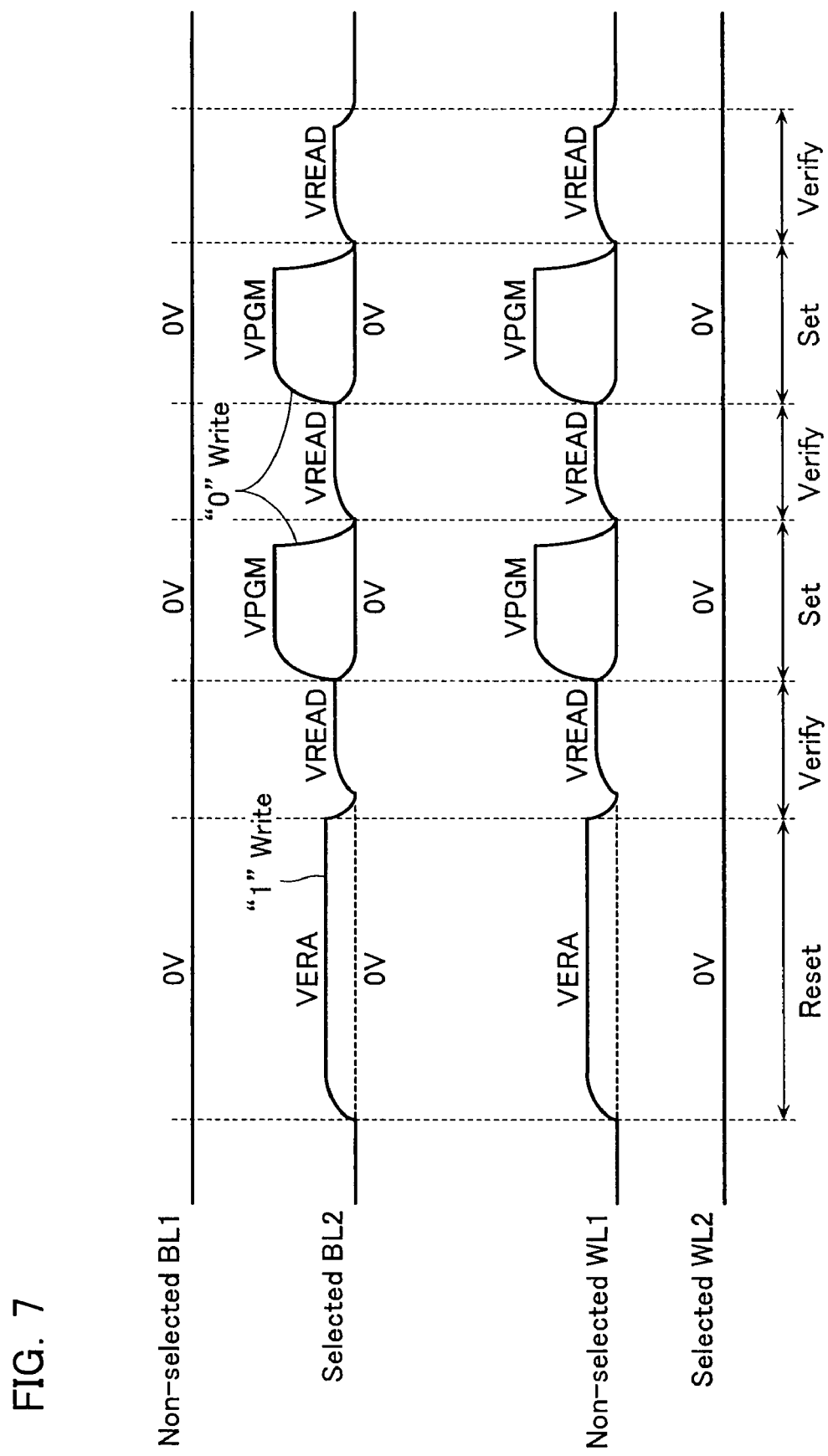
FIG. 7 shows waveforms of a detailed write-verify operation.

Prior to the explanation for the four-level data example, write sequence will be explained in brief with reference to FIG. 7. FIG. 7 shows the write operation waveforms in the case that cell MC22 is selected in the cell array shown in FIG. 1.

The selected cell MC22 is initially reset, and then verify-read and write are repeatedly performed. The reset operation is, as described in the basic operation explanation, performed as to apply the reset voltage VERA to the selected bit line BL2 and non-selected word line WL1. As a result, the selected cell is reset at the high resistance state through the thermal process continuing a certain time.

The verify-read is for applying read voltage VREAD to the selected bit line BL2 to verify the resistance value of the selected cell MC22. Assuming that the rising voltage of forward-biased diode Di is Vd, and necessary read voltage to be applied to the variable resistance element VR is Vr (<Vrs), the read voltage VREAD is set as follows: VREAD=Vd+Vr. As similar to the set operation, non-selected word line is applied with Vread as a blocking voltage.

By use of this write sequence, four resistance value states are sequentially obtained in order from the reset state (i.e., high resistance state). The following examples are four-level setting examples.

[1st Four-Level Data Setting Example]

Figure 8:
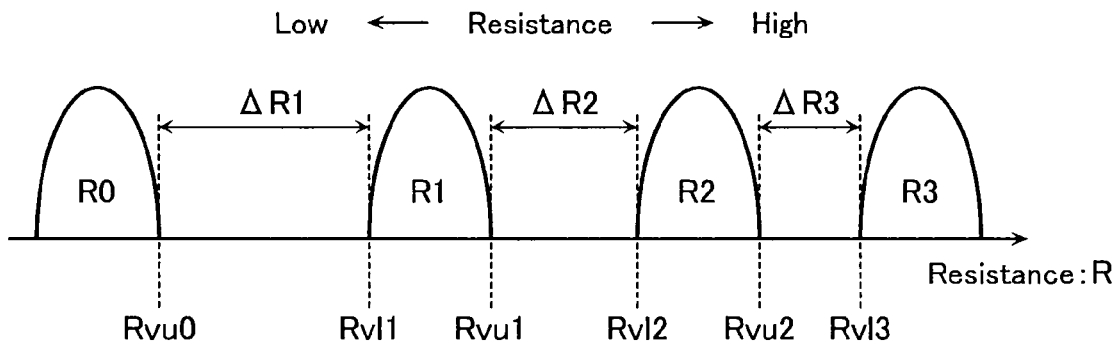
FIG. 8 shows a four-level data distribution example of a ReRAM.

FIG. 8 shows a first four-level data setting example with respect to a ReRAM, in which the set state with a low resistance easily shifts to the high resistance state. The lowest resistance value R0, and resistance values R1, R2 and R3 (R0<R1<R2<R3) constitute a four-level data.

The upper limit values Rvu0, Rvu1 and Rvu2 of respective distributions of R0, R1 and R2 are levels determined by the verify-read in the set operation. The lower limit value Rvl3 of R3 is a level determined by the verify-read in the reset operation. With respect to the resistances R1 and R2, not only the upper limits but also the lower limits Rvl1 and Rvl2 are verified.

Here is assumed that data R3 with the highest resistance value is the reset state, and resistance data R2, R1 and R0 are set from the reset state. In this case, resistance R0 is the most unstable, and easily shifts toward the high resistance side. In consideration of this, assuming that the resistance gaps between R0, R1, R2 and R3 are $\Delta R1(=R1-R0)$, $\Delta R2(=R2-R1)$ and $\Delta R3(=R3-R2)$, respectively, these are set to satisfy the following relationship of: $\Delta R1 > \Delta R2 \geq \Delta R3$.

That is, gap $\Delta R1$ between the lowest resistance value R0 and the following resistance value R1 is set to be larger than other gaps. As a result, it becomes possible to distinguish between resistance values R0 and R1 even if resistance value R0 shifts a little toward the high resistance value side. Therefore, it is obtained a good data retention property. It should be appreciated that $\Delta R2 = \Delta R3$ is allowed.

Since practical resistance value data distribution is set in a large resistance value range, the lateral axis (resistance value axis) of the resistance value distribution shown in FIG. 8 is not a linear scale, but a logarithm scale. In this case, a more preferable relationship corresponding to the above-described relationship of: $\Delta R1 > \Delta R2 \geq \Delta R3$ will be expressed as follows: $\Delta R1/R1 > \Delta R2/R2 \geq \Delta R3/R3$. Used here as R1, R2 and R3 in this expression are, for example, central values in the respective resistance value distributions. Alternatively, the lower limit values Rvl1, Rvl2 and Rvl3 of the respective resistance value distributions may be used in place of central values.

[2nd Four-Level Data Setting Example]

Figure 9:
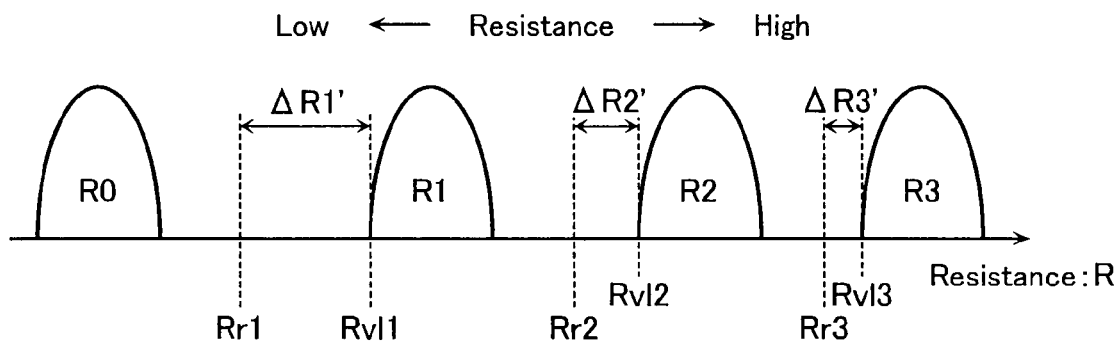
FIG. 9 shows another four-level data distribution example.

FIG. 9 shows a second four-level data setting example with respect to a ReRAM, in which the set state with a low resistance value easily shifts to the high resistance state. With respect to four resistance values R0, R1, R2 and R3 (R0<R1<R2<R3) like those in FIG. 8, read threshold resistance values Rr1, Rr2 and Rr3 are set between the respective resistance value distributions.

Assuming that there are gaps $\Delta R1'$, $\Delta R2'$ and $\Delta R3'$ between the read threshold values Rr1, Rr2 and Rr3 and the lower limit values Rvl1, Rvl2 and Rvl3 of the resistance values R1, R2 and R3, respectively, i.e., $\Delta R1'=Rvl1-Rr1$, $\Delta R2'=Rvl2-Rr2$ and $\Delta R3'=Rvu3-Rr3$, it is set to satisfy the following relationship of: $\Delta R1' > \Delta R2' \geq \Delta R3'$. Setting this relationship, it becomes possible to distinguish between resistance values R0 and R1 even if resistance value R0 shifts a little toward the high resistance value side. Therefore, it is obtained a good data retention property. It should be appreciated that $\Delta R2' = \Delta R3'$ is allowed.

In case the resistance value distributions are expressed on a logarithm scale, a more preferable relationship corresponding to the above-described relationship of: $\Delta R1' > \Delta R2' \geq \Delta R3'$ will be expressed as follows: $\Delta R1'/Rr1 > \Delta R2'/Rr2 \geq \Delta R3'/Rr3$.

[3rd Four-Level Data Setting Example]

Figure 10:
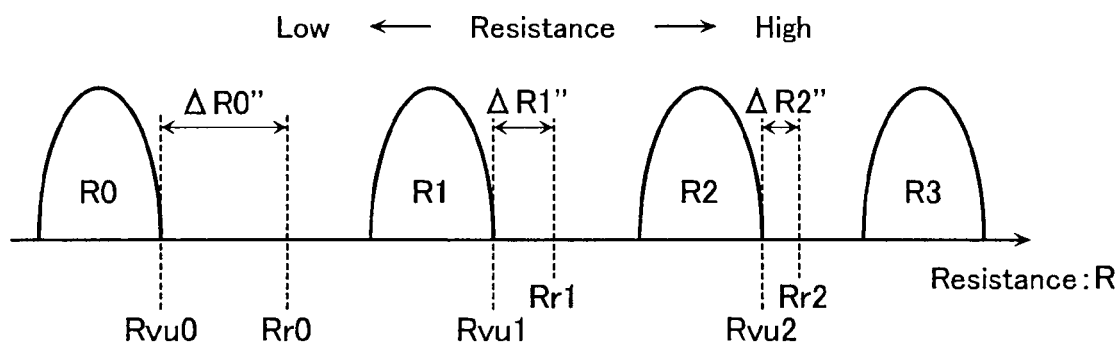
FIG. 10 shows another four-level data distribution example.

FIG. 10 shows a third four-level data setting example with respect to a ReRAM, in which the set state with a low resistance easily shifts to the high resistance state. With respect to four resistance values R0, R1, R2 and R3 (R0<R1<R2<R3) like those in FIGS. 8 and 9, read threshold resistance values Rr1, Rr2 and Rr3 are set between the respective resistance value distributions.

Assuming that there are gaps $\Delta R0''$, $\Delta R1''$ and $\Delta R2''$ between the read threshold values Rr1, Rr2 and Rr3 and the upper limit values Rvu0, Rvu1 and Rvu2 of the resistance values R0, R1 and R2, respectively, i.e., $\Delta R0''=Rr0-Rvu0$, $\Delta R1''=Rr1-Rvu1$ and $\Delta R2''=Rr2-Rvu2$, it is set to satisfy the following relationship of: $\Delta R0'' > \Delta R1'' \geq \Delta R2''$. Setting this relationship, it becomes possible to distinguish between resistance values R0 and R1 even if resistance value R0 shifts a little toward the high resistance value side. Therefore, it is obtained a good data retention property. It should be appreciated that $\Delta R1'' = \Delta R2''$ is allowed.

In case the resistance value distributions are expressed on a logarithm scale, a more preferable relationship corresponding to the above-described relationship of: $\Delta R0'' > \Delta R1'' \geq \Delta R2''$ will be expressed as follows: $\Delta R0''/Rr0 > \Delta R1''/Rr1 \geq \Delta R2''/Rr2$.

[4th Four-Level Data Setting Example]

Figure 11:
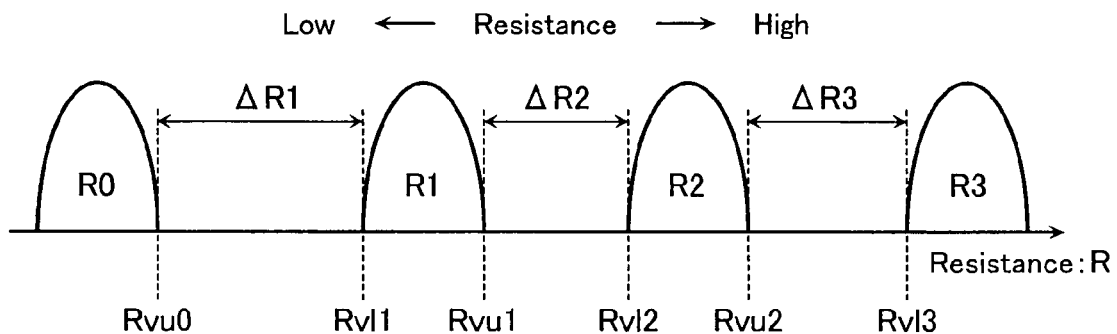
FIG. 11 shows another four-level data distribution example.

FIG. 11 shows a fourth four-level data setting example with respect to a ReRAM, in which the set state with a low resistance easily shifts to the high resistance state. This is a modified one of the 1st example shown in FIG. 8. That is, $\Delta R2 \geq \Delta R3$ is supposed in the example shown in FIG. 8 based on the reason that the resistance value R3 is the highest and most stable. However, it may occur such a situation that resistance value R3 easily shifts to the low resistance state. In consideration of this, in this example, $\Delta R3 > \Delta R2$ is set. $\Delta R1 > \Delta R2$ is the same as the example shown in FIG. 8.

In case the resistance value distributions are expressed on a logarithm scale, a more preferable relationship corresponding to the above-described relationship of: $\Delta R3 > \Delta R2$ and $\Delta R1 > \Delta R2$ will be expressed as follows: $\Delta R3/R3 > \Delta R2/R2$ and $\Delta R1/R1 > \Delta R2/R2$. Used here as R1, R2 and R3 in this expression are, for example, central values in the respective resistance value distributions. Alternatively, the lower limit values Rvl1, Rvl2 and Rvl3 of the respective resistance value distributions may be used in place of central values.

[5th Four-Level Data Setting Example]

Figure 12:
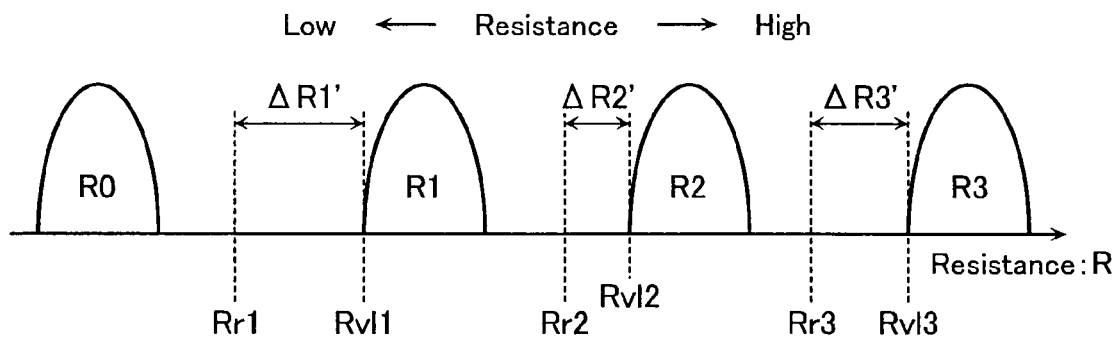
FIG. 12 shows another four-level data distribution example.

FIG. 12 shows a fifth four-level data setting example with respect to a ReRAM, in which the set state with a low resistance easily shifts to the high resistance state. This is a modified one of the 2nd example shown in FIG. 9. That is, $\Delta R2' \geqq \Delta R3'$ is supposed in the example shown in FIG. 9. However, it may occur such a situation that resistance value R3 easily shifts to the low resistance state. In consideration of this, in this example, $\Delta R3' > \Delta R2'$ is set. $\Delta R1' > \Delta R2'$ is the same as the example shown in FIG. 9.

In case the resistance value distributions are expressed on a logarithm scale, a more preferable relationship corresponding to the above-described relationship of: $\Delta R3' > \Delta R2'$ and $\Delta R1' > \Delta R2'$ will be expressed as follows: $\Delta R3'/Rr3 > \Delta R2'/Rr2$ and $\Delta R1'/Rr1 > \Delta R2'/Rr2$.

[6th Four-Level Data Setting Example]

Figure 13:
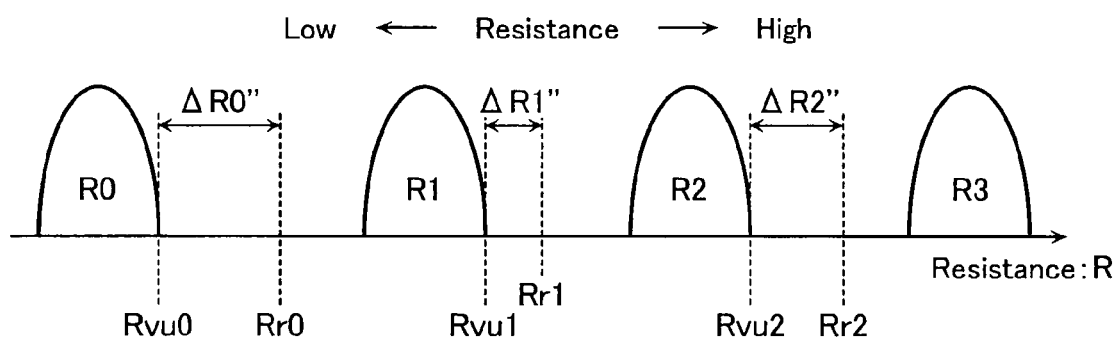
FIG. 13 shows another four-level data distribution example.

FIG. 13 shows a sixth four-level data setting example with respect to a ReRAM, in which the set state with a low resistance easily shifts to the high resistance state. This is a modified one of the third example shown in FIG. 10. That is, $\Delta R1'' \geqq \Delta R2''$ is supposed in the example shown in FIG. 10. However, it may occur such a situation that resistance value R3 easily shifts to the low resistance state. In consideration of this, in this example, $\Delta R2'' > \Delta R1''$ is set. $\Delta R0'' > \Delta R1''$ is the same as the example shown in FIG. 10.

In case the resistance value distributions are expressed on a logarithm scale, a more preferable relationship corresponding to the above-described relationship of: $\Delta R2'' > \Delta R1''$ and $\Delta R0'' > \Delta R1''$ will be expressed as follows: $\Delta R2''/Rr2 > \Delta R1''/Rr1$ and $\Delta R0''/Rr0 > \Delta R1''/Rr1$.

Each of the 1st to 6th four-level data setting examples described above is for such a ReRAM that the set state with a low resistance easily shifts to the high resistance state. Next, other four-level data setting examples will be explained, in each of which the set state is an unstable high resistance state and easily shifts to the low resistance state. In detail, these examples are PCRAMs with a chalcogenide recording layer.

Note here in the examples described below that in case the resistance value distributions are expressed on a logarithm scale, the simple relationship between resistance value differences will be replaced with the relationship between resistance value differences/resistance values like in the 1st to 5th examples explained above. The detailed explanations will be omitted.

[7th Four-Level Data Setting Example]

Figure 14:
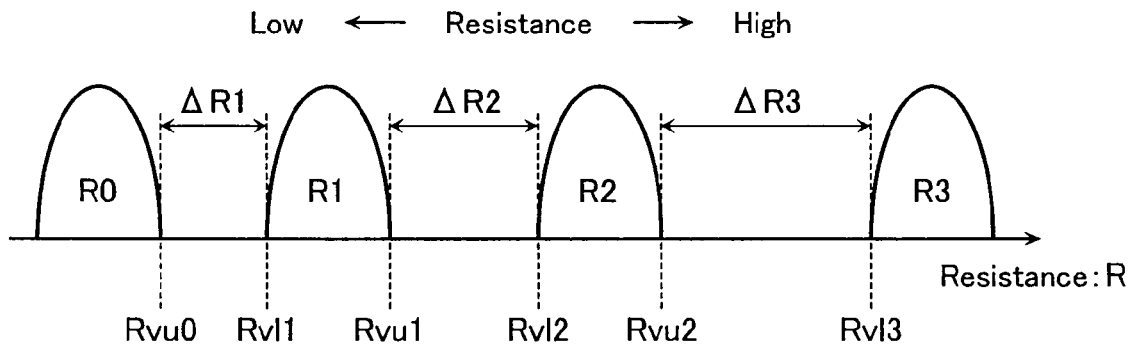
FIG. 14 shows a four-level data distribution example of a PCRAM.

FIG. 14 shows a seventh four-level data setting example, i.e., a RCRAM, in which the set state with a high resistance easily shifts to the low resistance state. The lowest resistance value R0, and resistance values R1, R2 and R3 (R0<R1<R2<R3) constitute a four-level data.

The lower limits Rv11, Rv12 and Rv13 of resistance value distributions of R1, R2 and R3, respectively, are defined by verify-read operations in the respective set operations. The upper limit Rvu0 of the resistance value R0 is defined by verify-read operation in the reset operation. With respect to resistances R1 and R2, not only the lower limits Rv11 and Rv12 but also the upper limits Rvu1 and Rvu2 are verified.

Here is assumed that data R0 with the lowest resistance value is the reset state, and resistance data R1, R2 and R3 are set from the reset state. In this case, resistance R3 is the most unstable, and easily shifts toward the low resistance side. In consideration of this, the resistance gaps between R0, R1, R2 and R3, i.e., $\Delta R1(=R1-R0)$, $\Delta R2(=R2-R1)$ and $\Delta R3(=R3-R2)$ are set to satisfy the following relationship of: $\Delta R3 > \Delta R2 \geqq \Delta R1$.

That is, gap $\Delta R3$ between the highest resistance value R3 and the following resistance value R2 is set to be larger than other gaps. As a result, it becomes possible to distinguish between resistance values R2 and R3 even if resistance value R3 shifts a little toward the low resistance value side. Therefore, it is obtained a good data retention property. It should be appreciated that $\Delta R1=\Delta R2$ is allowed.

[8th Four-Level Data Setting Example]

Figure 15:
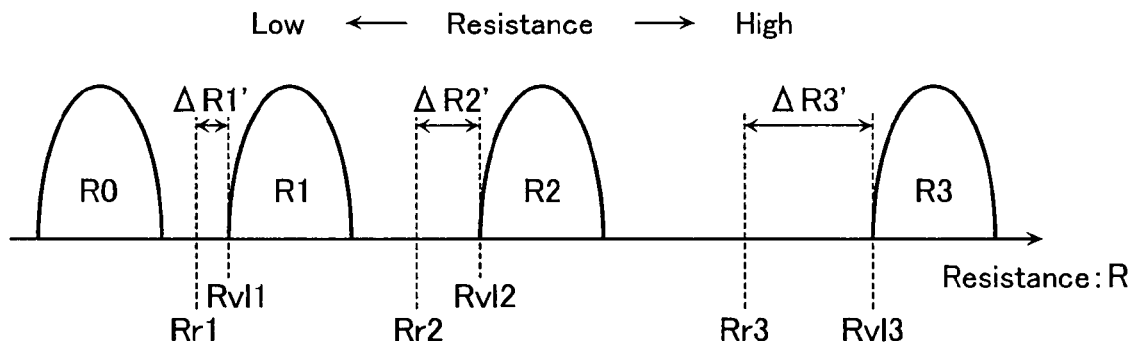
FIG. 15 shows another four-level data distribution example.

FIG. 15 shows an eighth four-level data setting example with respect to a RCRAM, in which the set state with a high resistance easily shifts to the low resistance state. With respect to four resistance value R0, R1, R2 and R3 (R0<R1<R2<R3) like the example shown in FIG. 14, read threshold values Rr1, Rr2 and Rr3 are set between the respective resistance values.

Assuming that there are gaps $\Delta R1'$, $\Delta R2'$ and $\Delta R3'$ between the read threshold values Rr1, Rr2 and Rr3 and the lower limit values Rv11, Rv12 and Rv13 of the resistance values R2, R2 and R3, respectively, i.e., $\Delta R1'=Rv11-Rr1$, $\Delta R2'=Rv12-Rr2$ and $\Delta R3'=Rv13-Rr3$, it is set to satisfy the following relationship of: $\Delta R3' > \Delta R2' \geqq \Delta R1'$. Setting this relationship, it becomes possible to distinguish between resistance values R2 and R3 even if resistance value R3 shifts a little toward the low resistance value side. Therefore, it is obtained a good data retention property. It should be appreciated that $\Delta R1'=\Delta R2'$ is allowed.

[9th Four-Level Data Setting Example]

Figure 16:
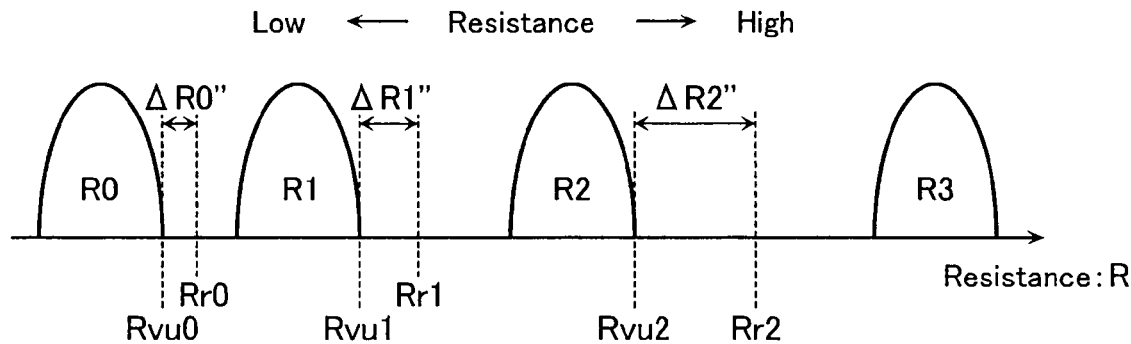
FIG. 16 shows another four-level data distribution example.

FIG. 16 shows a ninth four-level data setting example with respect to a RCRAM, in which the set state with a high resistance easily shifts to the low resistance state. As similar to the examples shown in FIGS. 14 and 15, read threshold values Rr0, Rr1 and Rr2 are set between the four resistance value R0, R1, R2 and R3 (R0<R1<R2<R3).

Assuming that there are gaps $\Delta R0''$, $\Delta R1''$ and $\Delta R2''$ between the higher limit values Rvu0, Rvu1 and Rvu2 of the resistance values R0, R1 and R2 and the read threshold values Rr0, Rr1 and Rr2, respectively, i.e., $\Delta R0''=Rr0-Rvu0$, $\Delta R1''=Rr1-Rvu1$ and $\Delta R2''=Rr2-Rvu2$, it is set to satisfy the following relationship of: $\Delta R2'' > \Delta R1'' \geqq \Delta R0''$. Setting this relationship, it becomes possible to distinguish between resistance values R2 and R3 even if resistance value R3 shifts a little toward the low resistance value side. Therefore, it is obtained a good data retention property. It should be appreciated that $\Delta R0''=\Delta R1''$ is allowed.

[10th Four-Level Data Setting Example]

Figure 17:
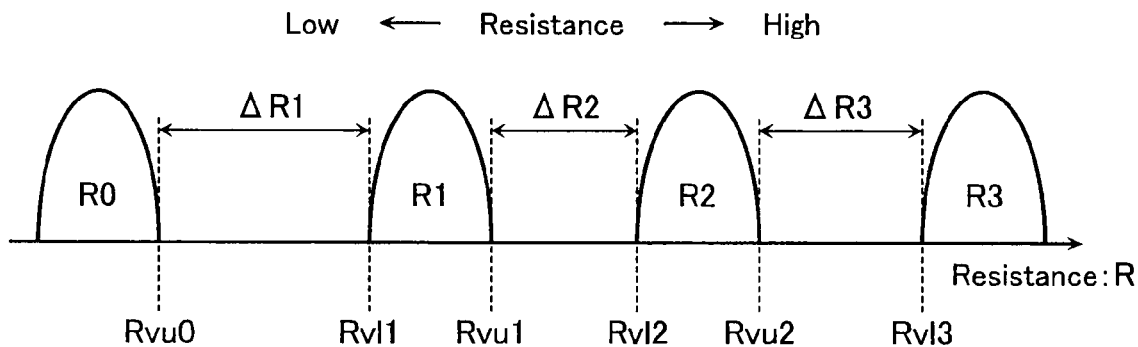
FIG. 17 shows another four-level data distribution example.

FIG. 17 shows a tenth four-level data setting example with respect to a RCRAM, in which the set state with a high resistance easily shifts to the low resistance state. This is a modified one of the 7th example shown in FIG. 14. That is, $\Delta R2 \geqq \Delta R1$ is supposed in the example shown in FIG. 14 based on the reason that the resistance value R0 is the lowest and most stable. However, it may occur such a situation that resistance value R0 easily shifts to the high resistance state. In consideration of this, in this example, $\Delta R1 > \Delta R2$ is set. $\Delta R3 > \Delta R2$ is the same as the 7th example shown in FIG. 14.

[11th Four-Level Data Setting Example]

Figure 18:
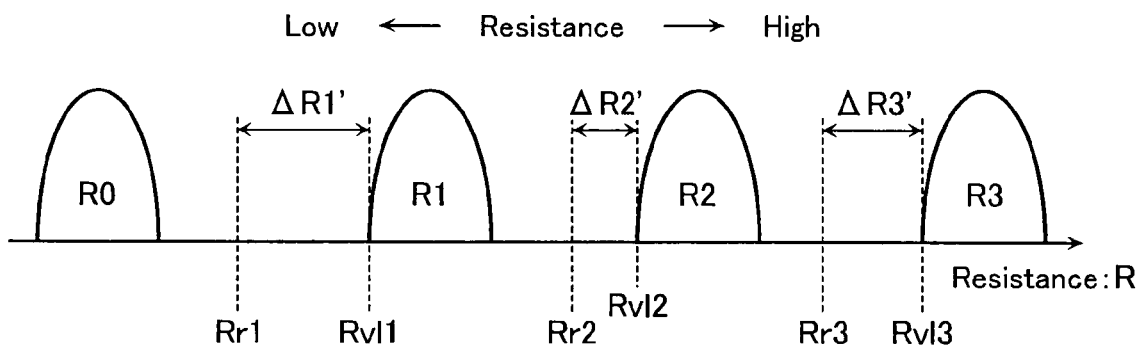
FIG. 18 shows another four-level data distribution example.

FIG. 18 shows an eleventh four-level data setting example with respect to a RCRAM, in which the set state with a high resistance easily shifts to the low resistance state. This is a modified one of the 8th example shown in FIG. 15. $\Delta R2' \geqq \Delta R1'$ is supposed in the example shown in FIG. 15. However, it may occur such a situation that resistance value R0 easily shifts to the high resistance state. In consideration of this, in this example, $\Delta R1' > \Delta R2'$ is set. $\Delta R3' > \Delta R2'$ is the same as the 8th example shown in FIG. 15.

[12th Four-Level Data Setting Example]

Figure 19:
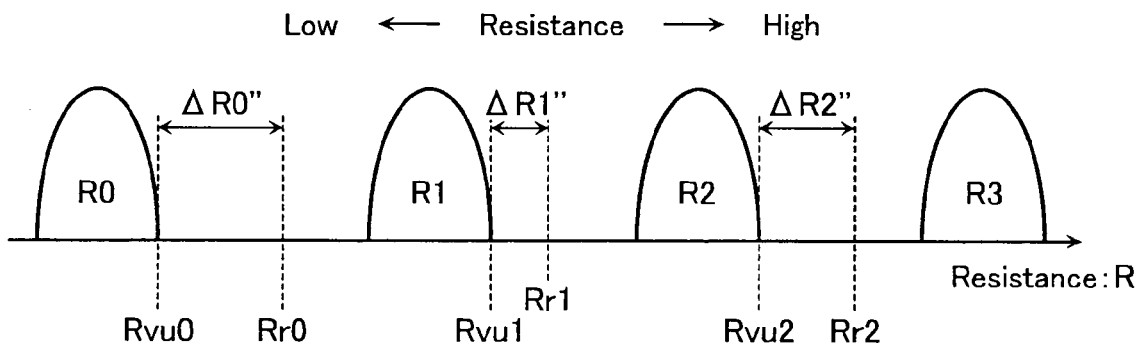
FIG. 19 shows another four-level data distribution example.

FIG. 19 shows a twelfth four-level data setting example with respect to a RCRAM, in which the set state with a high resistance easily shifts to the low resistance state. This is a modified one of the 9th example shown in FIG. 16. $\Delta R1'' \geqq \Delta R0''$ is supposed in the example shown in FIG. 16. However, it may occur such a situation that resistance value R0 easily shifts to the high resistance state. In consideration of this, in this example, ΔR0">ΔR1" is set. ΔR2">ΔR1" is the same as the 8th example shown in FIG. 16.

[Read/Write Circuit and Operation Thereof Used in a ReRAM]

Figure 20:
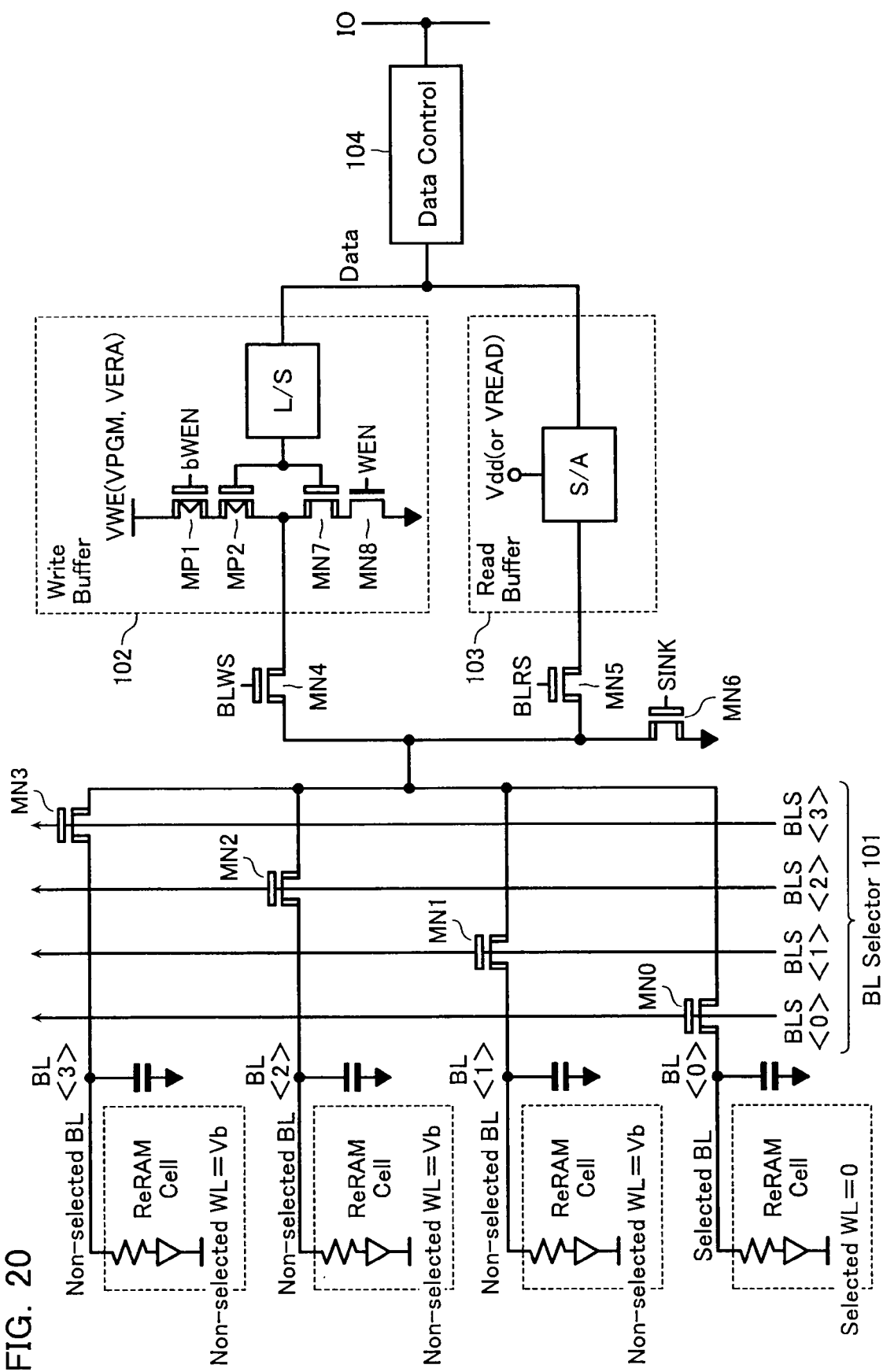
FIG. 20 shows a read/write circuit of a ReRAM.

FIG. 20 shows a read/write circuit, which has: bit line selector 101; write buffer 102 and read buffer 103 coupled to a selected bit line via the bit line selector 101; and data control circuit 104 disposed between these write/read buffers 102/103 and dada line I/O.

Bit line selector 101 has in this example four select NMOS transistors MN0-MN3, which are selectively driven by select signals BLS<0>-<3> to select one of four bit lines BL<0>-<3>. Select NMOS transistors MN0-MN3 are high breakdown voltage transistors. When bit line BL<0> is selected, corresponding selected word line is set at Vss(=0V); and non-selected word lines are set at a blocking voltage selected in level in accordance with write or read operation.

Note here that in case of the 3D cell array explained with reference to FIG. 2, it is required of the bit line selector 101 to have not only a cell array selecting function but also a bit line selecting function in a cell array. Therefore, the bit line selector 101 is formed more complicated in practice. Shown here is a simple example, which is formed to select one in four bit lines.

A selected bit line selected by selector 101 is coupled to write buffer 102 via switch NMOS transistor MN4 driven by write-select signal BLWS to be turned on, or coupled to read buffer 103 via switch NMOS transistor MN5 driven by read-select signal BLRS to be turned on. These NMOS transistors MN4 and MN5 are also high breakdown voltage ones.

Write buffer 102 has a CMOS driver formed of PMOS transistor MP2 and NMOS transistor MN7. PMOS transistor MP2 is coupled to voltage applying node VWE via activation PMOS transistor MP1. NMOS transistor MN7 is coupled to ground potential node Vss via activation NMOS transistor MN8. Applied to the common gate of the CMOS driver is write data supplied via level shifter L/S.

Figure 21:
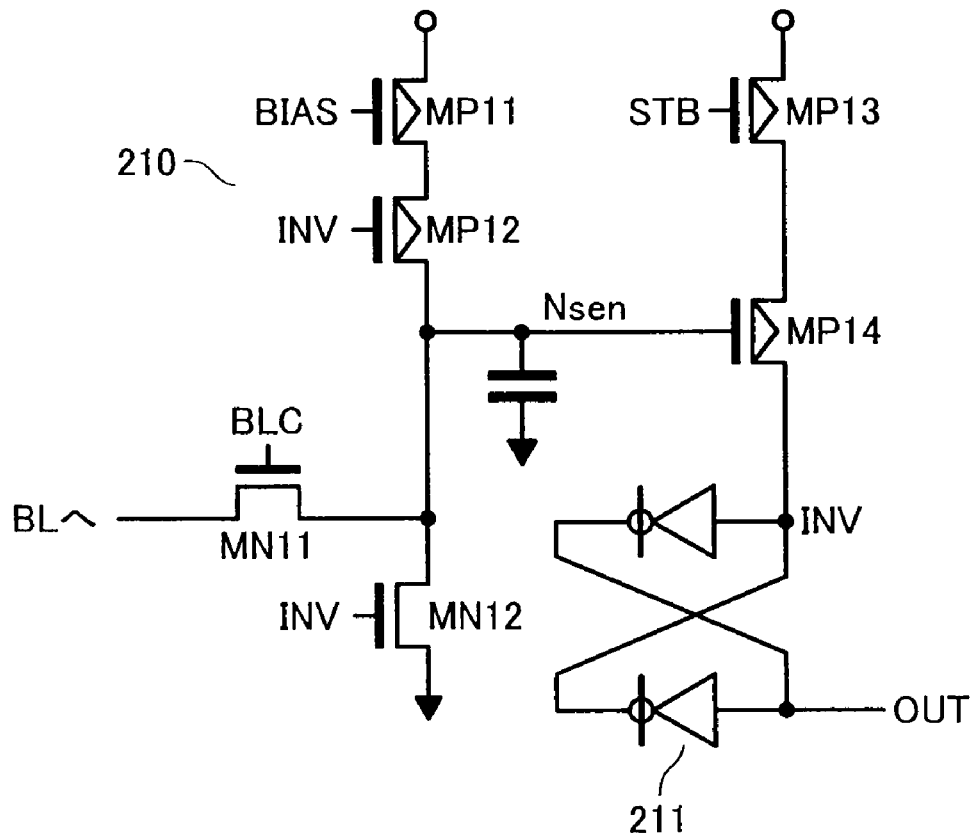
FIG. 21 shows an example of the sense amplifier.
Figure 22:
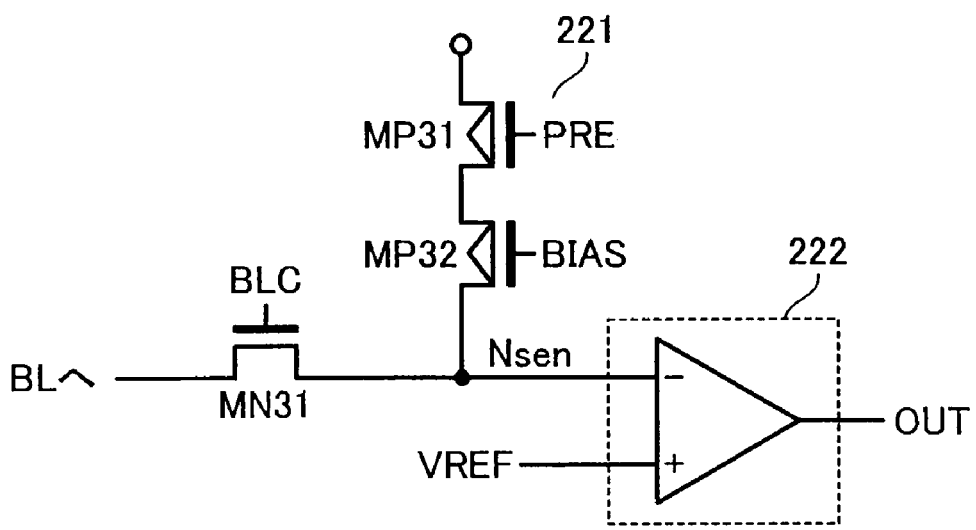
FIG. 22 shows anther example of the sense amplifier.
Figure 23:
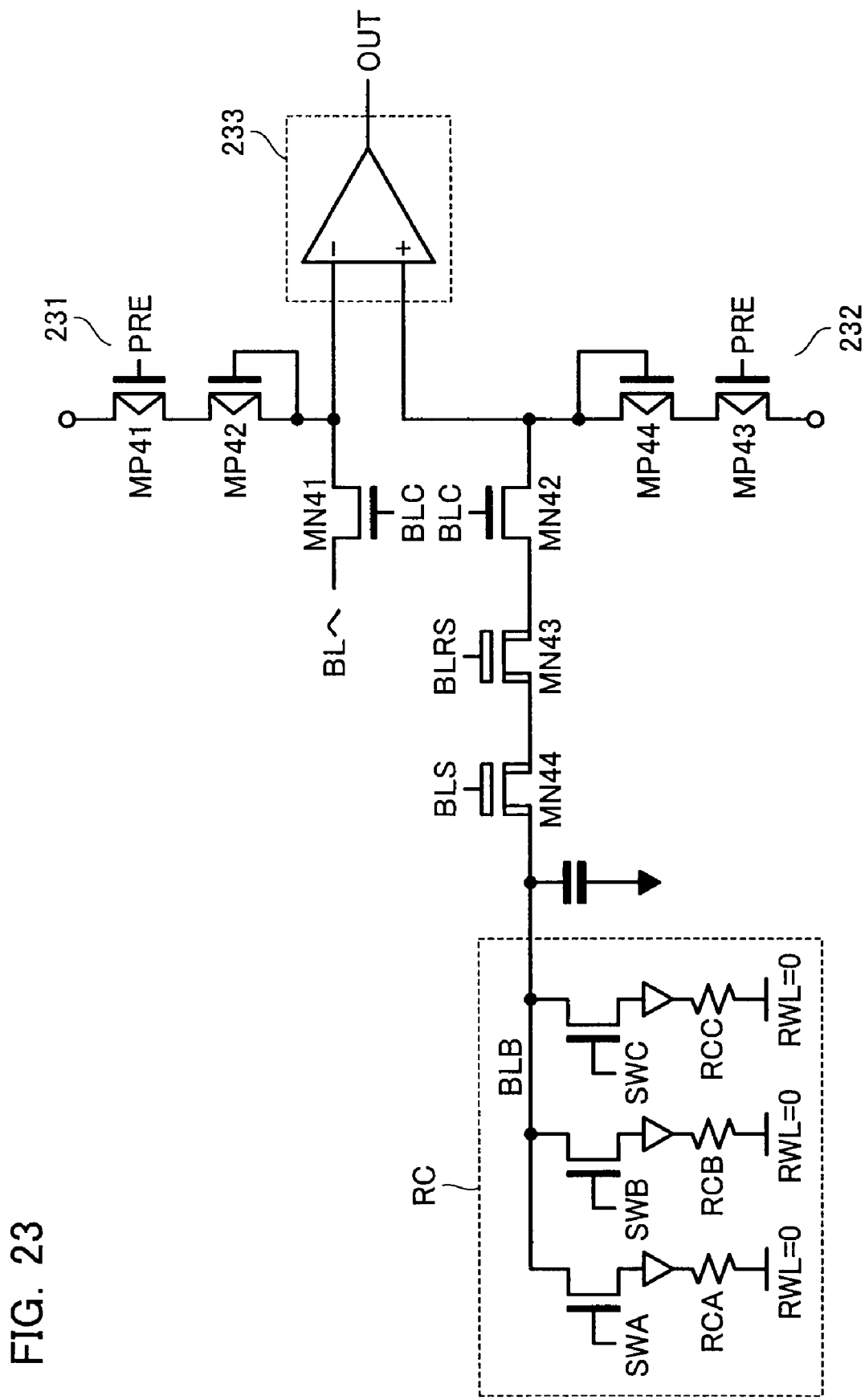
FIG. 23 shows still anther example of the sense amplifier.

Used as the sense amplifier S/A in the read buffer 103 is one of some types of sense amplifiers. FIGS. 21 to 23 show examples of the sense amplifier S/A.

The sense amplifier S/A shown in FIG. 21 has serially connected PMOS transistors MP11 and MP12 constituting a current source circuit 210, which is coupled to bit line BL via selecting NMOS transistor MN11. Connecting node, Nsen, between PMOS transistor MP12 and NMOS transistor MN11 is a sense node, which is coupled to Vss via NMOS transistor MN12.

Sense node Nsen is coupled to the gate of PMOS transistor MP14, the drain of which is coupled to node INV of latch 211. The source of PMOS transistor MP14 is coupled to Vdd via PMOS transistor MP13. PMOS transistor MP12 and NMOS transistor MN12 are driven by node INV of latch 211 to be complementarily turned on/off. Gate control signal STB applied to the gate of PMOS transistor MP13 is a sense/latch pulse, which becomes "L" at a data sense time.

PMOS transistor MP11 of the current source circuit 210 is driven by bias voltage BIAS, which is selected in level in accordance with data to be sensed. That is, a threshold current (reference current), which is to be compared with a cell current, is generated by this PMOS transistor MP11. Applied to the source of PMOS transistor MP11 is Vdd or read voltage VREAD set to be different from Vdd. VREAD is set at a suitable level higher than the voltage drop Vdi of the forward-biased cell diode Di.

At a sense time, the potential of sense node Nsen is decided based on the current balance between the sinking current of a selected cell and the threshold current of the current source circuit 210, which is changed in accordance with bias voltage BIAS. Explaining in detail, for example, the threshold currents are set as follows: assuming that the threshold currents are I1, I2 and I3 as corresponding to read threshold values (resistance values) Rr1, Rr2, Rr3 shown in FIG. 9, respectively, and that bias voltages BIAS are set at B1, B2 and B3 for generating the threshold currents I1, I2 and I3, respectively, the threshold currents I1, I2 and I3 are set at judgment steps for distinguishing between R0 and R1, R1 and R2, and R2 and R3 to satisfy the relationship of: B1<B2<B3 and I1>I2>I3.

Through three sense operations, the combination of "H" and "L" levels of the sense node Nsen is decided in accordance with the precharged bit line discharge current due to the selected cell and the bit line supply current supplied from the current source circuit, and 4-level data will be judged based on the combination.

The sense amplifier operation will be explained in detail below. Initially, reset latch 211 in a state of INV="L", and then precharge a selected bit line with the current source circuit 210. While word lines are applied with a blocking voltage at this time, sense node Nsen is charged up to read voltage VREAD together with the selected bit line.

At this bit line precharge time, the current source circuit 210 is made to be highly current-drivable with BIAS=Vss. During the bit line precharge operation and the successive bit line discharge operation, PMOS transistor MP12 is kept off with STB="H", so that INV="L" is kept, and the current source circuit 210 is kept on.

A selected word line being set at Vss after the bit line precharging, the selected bit line BL will be discharged in accordance with the resistance state of the selected cell. While the selected bit line is discharged, the current source circuit 210 supplies a predetermined threshold current defined by the bias voltage. As a result, the selected bit line BL and sense node Nsen will be set at a certain voltage defined by the balance between the "potential drop" due to the bit line discharge current based on the selected cell and the "potential boost" based on the charging current supplied from the current source circuit 210. After a certain time after starting the bit line discharge operation, set STB="L", and the level of sense node Nsen is detected by PMOS transistor MP14.

Assuming that the cell resistance to be detected is lower than the read threshold, and sense node Nsen is lowered to a certain level or lower, PMOS transistor MP14 is turned on, so that node INV is inverted to "H". Receiving it, the current source circuit 210 becomes off; NMOS transistor MN12 becomes on; and sense node Nsen is set at Vss. By contrast, in case the cell resistance is large, sense node Nsen is not sufficiently lowered, and PMOS transistor MP14 is not turned on.

Data sense may also be performed without the above-described bit line precharge operation as follows: while making the selected cell flow current on the condition that the selected word line is set at Vss from the beginning, supply the threshold current to the selected bit line, and detect the charged up level of the selected bit line. In this case also, the bit line boost curve and the balanced level will be determined based on the current balance between the threshold current set in the current source circuit 210 and the sinking current of the selected cell. Therefore, After the bit line precharging for a certain time, set STB="L", and the level of sense node Nsen may be detected with PMOS transistor MP14, and "H" or "L" thereof may be loaded in latch 211.

Sense amplifier S/A shown in FIG. 22 has current source circuit 221, which is formed of PMOS transistors MP31 and MP32 and coupled to bit line via select NMOS transistor MN31. Connection node between PMOS transistor MP32 and NMOS transistor MN31 is a sense node Nsen. Gate signal PRE of PMOS transistor MP31 becomes "L" at a read time while gate bias voltage BIAS of PMOS transistor MP32 is selected in accordance with a multi-level data level to be read for setting a threshold current.

This sense amplifier S/A detects the potential boosted level of the sense node Nsen due to bit line charging-up to sense data. It is the same as the case shown in FIG. 21 that the potential of sense node Nsen is determined based on the current balance between the threshold current set in the current source circuit 221 and the sinking current of the selected cell. The level of sense node Nsen is detected with differential amplifier 222 in comparison with reference level VREF.

While the sense amplifier S/A shown in FIG. 21 is of a single-end type, the sense amplifier S/A shown in FIG. 23 is a differential type of sense amplifier with a reference cell.

Coupled to bit line BL via select NMOS transistor MN41 is a current source load 231 with PMOS transistor MP42 while coupled to reference bit line BLB via select NMOS transistor MN42 is another current source load 232 with PMOS transistor MP44. These load PMOS transistors MP42 and MP44 are coupled to the power supply node Vdd via PMOS transistors MP41 and MP43, respectively, which are activated by control signal PRE.

There are disposed high-breakdown voltage NMOS transistors MN1 and MN2 (not shown) constituting a bit line selector between the bit line BL and select NMOS transistor MN41. Corresponding to these high-break down voltage transistors, there are disposed high-break down voltage NMOS transistors MN43 and MN44 between the reference bit line BLB and select NMOS transistor MN42.

Reference cell RC coupled to the reference bit line BLB has three cells (i.e., variable resistance elements) RCA, RCB and RCC, in which different reference resistance values are written. One of these three cells is selected by select signals SWA, SWB or SWC in accordance with a multi-level data level to be judged.

The difference current obtained between bit line BL and reference bit line BLB is detected with the differential amplifier 233.

Figure 24:
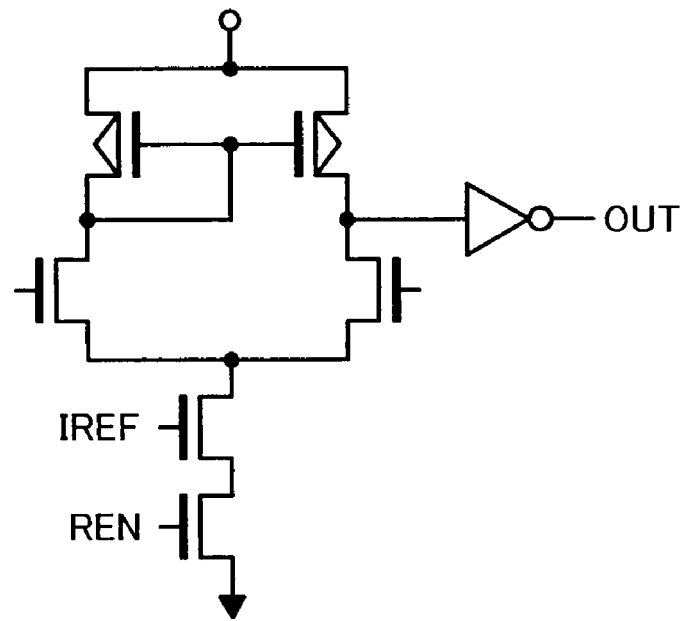
FIG. 24 shows a configuration example of the differential amplifier used in FIGS. 22 and 23.
Figure 25:
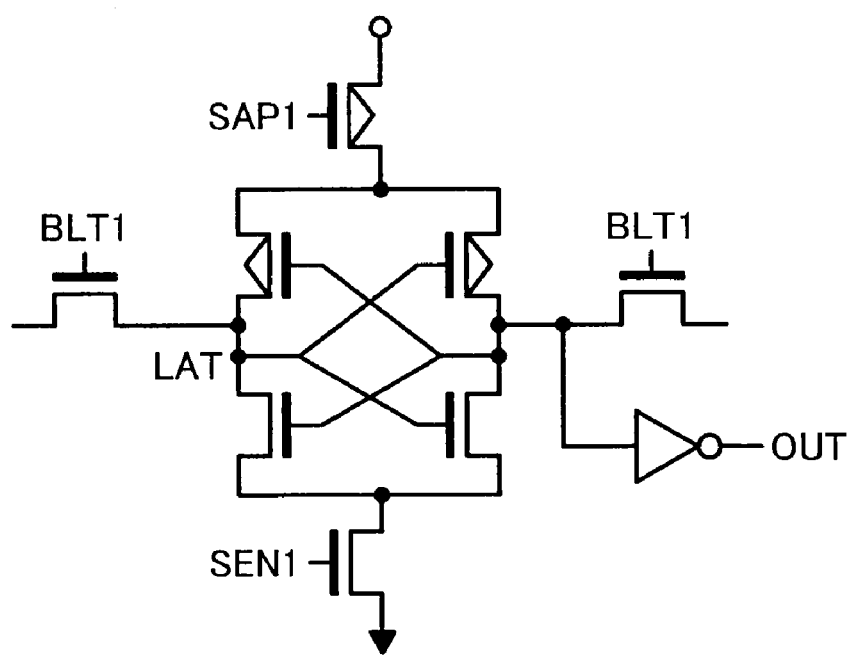
FIG. 25 shows another configuration example of the differential amplifier.

Differential amplifier 222 or 233 shown in FIG. 22 or 23 is formed of, for example, a current mirror type of differential amplifier shown in FIG. 24 or a latch type of differential amplifier shown in FIG. 25.

Figure 26:
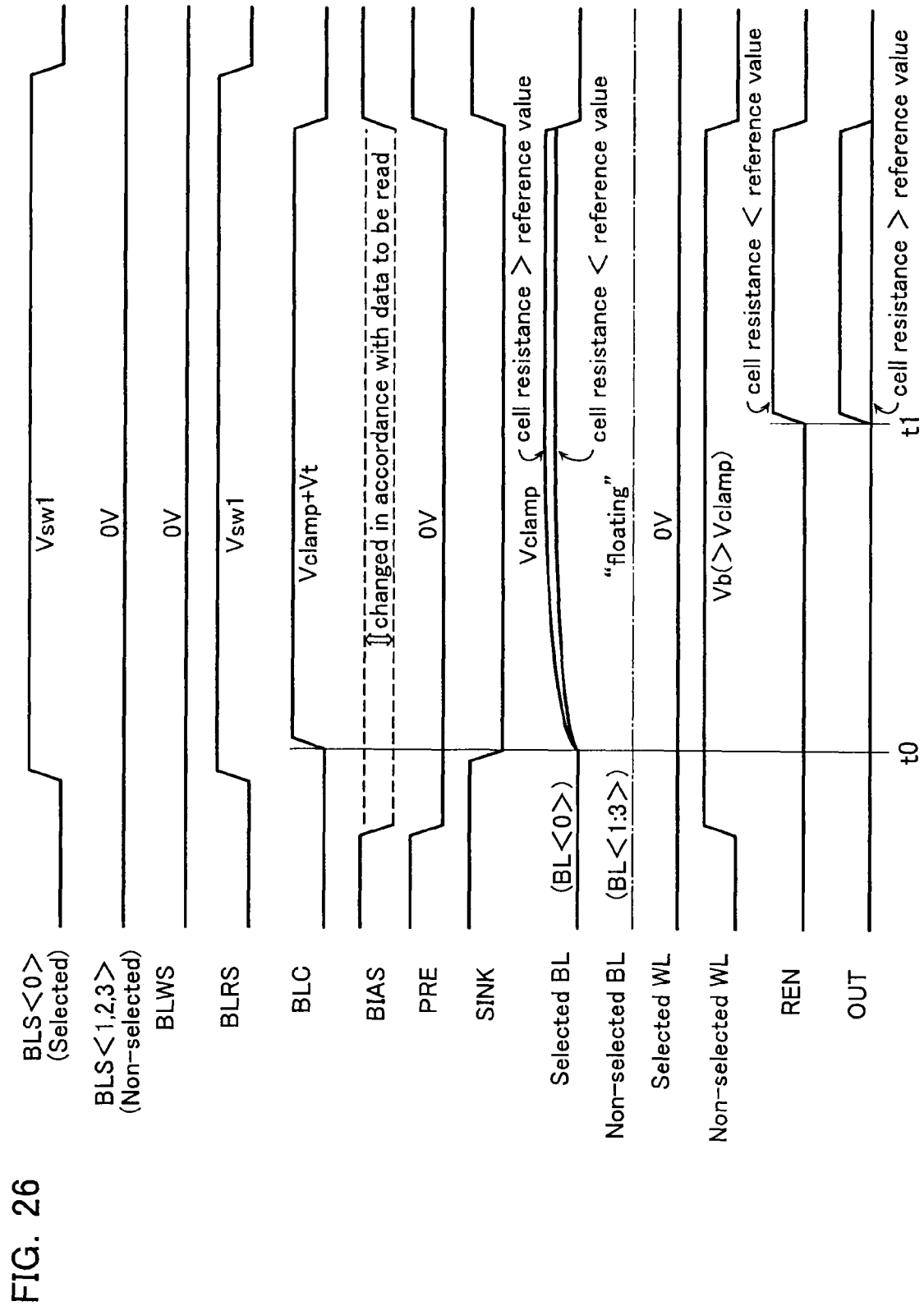
FIG. 26 shows read operation waveforms in case the sense amplifier shown in FIG. 22 is used.

FIG. 26 shows voltage waveforms of a data read operation (normal read and verify-read) in the case where sense amplifier S/A shown in FIG. 22 is used. Read voltage VREAD is applied to the power supply node of the current source circuit 221, and voltage Vsw1 is used as select signals BLS<0> and BLRS to be applied to the select transistors used for coupling a selected bit line to the sense amplifier. Voltage Vsw1 is set to able to transfer the supposed maximum value of the charged level Vclamp of the bit line. Applied as the select signal BLC is Vclamp+Vt (Vt: threshold voltage of NMOS transistor).

Bias voltage BIAS is selected in such a way as to carry a selected threshold current in accordance with data to be read. Non-selected word lines are applied with the blocking voltage.

Select signal BLC becoming "H" finally within necessary select signals, bit line charging starts (timing t0). The selected bit line is charged-up with a charging curve defined by the sinking current of the selected cell and the threshold current of the current source circuit 221. The voltage drop of the forward-biased cell diode is neglected here. After bit line charging for a certain time, activation signal REN="H" is generated (in case of the differential amplifier shown in FIG. 24) to activate the sense amplifier S/A (timing t1).

The bit line level will be detected in comparison with reference level VREF. In case the cell resistance value is higher than the threshold resistance value, sense output, OUT="L", is obtained while in case the cell resistance value is lower than the threshold resistance value, OUT="H" is obtained.

Figure 27:
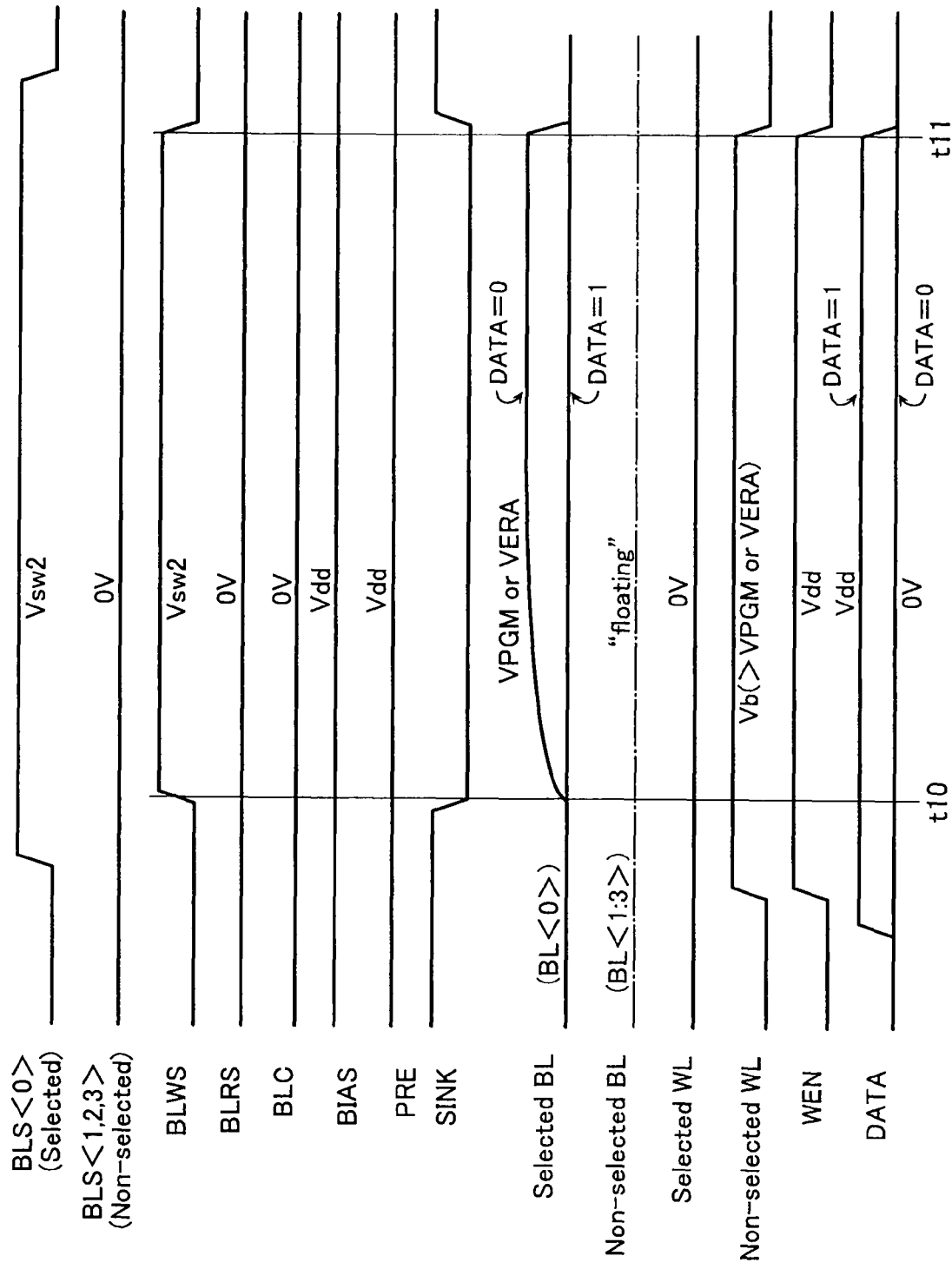
FIG. 27 shows write operation waveforms.

FIG. 27 shows waveforms of the set/reset operation with write buffer 102. Assuming that "set" and "reset" are defined as "write (or program)" and "erase", respectively, here is shown such a case that selected bit line BL<0> is applied with write (program) voltage VPGM or erase voltage VERA.

Select signal BLS<0> corresponding to the selected bit line and select signal BLWS for coupling the bit line to the write buffer are selected in level as to make the transistors driven by these select signals possible to transfer at least the write voltage VPGM and erase voltage VERA.

Write buffer 102 is supplied with data "0" in a case of writing or erasing and data "1" in another case of non-writing or non-erasing, and activated only in the former case. Write buffer 102 is activated with activation signals WEN=Vdd and bWEN=Vss.

Non-selected bit lines are set in a floating state; the selected word line is set at Vss; and non-selected word lines are applied with blocking voltage Vb(>VPGM, VERA). BLS and BLRS are set at Vss; BIAS and PRE are set at Vdd; and sense amplifier S/A is kept inactive and isolated from the bit line.

VPGM or VERA application for the selected bit line starts at timing t10, and write or erase is performed in a cell selected with data "0". Timing t11 shows an ending time of data write or erase. Here is not shown the voltage difference between write voltage VPGM and erase voltage VERA, and time difference between write voltage application time and erase voltage application time (t11-t10 is used here for both of write and erase). However, as explained with reference to FIG. 6, voltage levels and application times are suitably set in accordance with operation modes.

Next, some four-level data write schemes will be explained in detail below.

Figure 28:
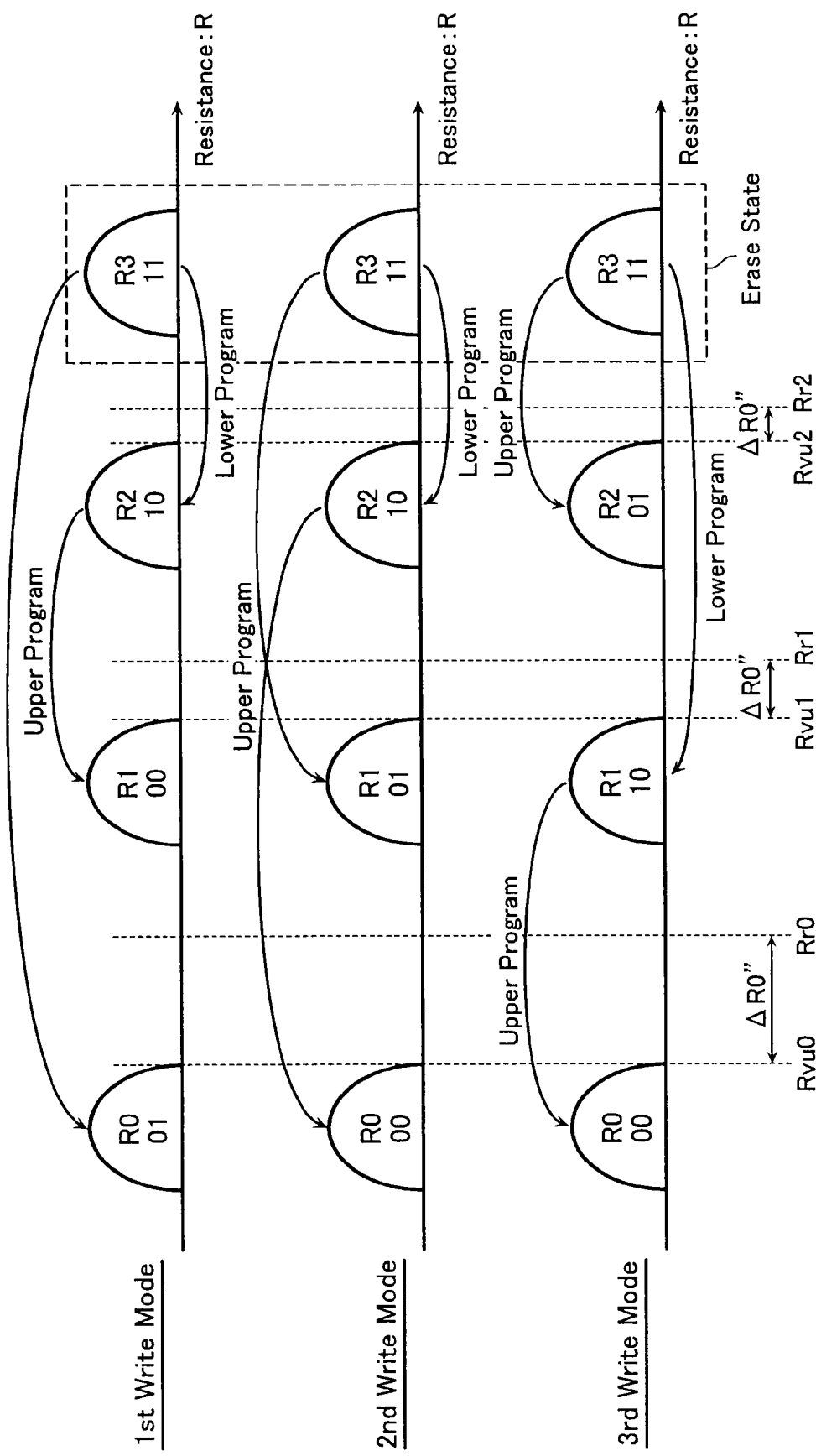
FIG. 28 shows first to third write modes, in which four-level data is adapted in such a way as: the high resistance state is defined as the erase state.

FIG. 28 shows three, first to third, write modes, in each of which cells are set in a reset state as an initial state, and then a set operation including the lower page write (or program) and the upper page write (or program) is performed for writing four-level data. Here, "reset" and "set" are defined as "write (or program)" and "erase", respectively. The erase state (reset state) with the maximum resistance value, R3, in four-level data is defined as "11".

In the first write mode, as the resistance values R2, R1 and R0 are reduced in level in this order, data "10", "00" and "01" are bit-assigned to them, respectively. In detail, data "10" (resistance value R2) is written in the lower page write cycle; and then data "01" (resistance value R0) and data "00" (resistance value R1) are written from "11" and "01", respectively, in the upper page write cycle.

In the second write mode, as the resistance values R2, R1 and R0 are reduced in level in this order, data "10", "01" and "00" are bit-assigned to them, respectively. In detail, data "10" (resistance value R2) is written in the lower page write cycle; and then data "01" (resistance value R1) and data "00" (resistance value R0) are written from "11" and "10", respectively, in the upper page write cycle.

In the third write mode, as the resistance values R2, R1 and R0 are reduced in level in this order, data "01", "10" and "00" are bit-assigned to them, respectively. In detail, data "10" (resistance value R1) is written in the lower page write cycle; and then data "01" (resistance value R2) and data "00" (resistance value R0) are written from "11" and "10", respectively, in the upper page write cycle.

In the above-described first to third write modes, write-verify levels of the resistance values R0, R1 and R2 are the upper limit values Rvu0, Rvu1 and Rvu2 of the resistance value distributions, respectively. Assuming that read levels Rr0, Rr1 and Rr2 are set between the respective resistance values as defined in order from the lower side, in this embodiment, $\Delta R0''=Rr0-Rvu0$, $\Delta R1''=Rr1-Rvu1$ and $\Delta R2''=Rr2-Rvu2$ are set, as similar to that explained with reference to FIG. 10, to satisfy the relationship of: $\Delta R0''>\Delta R1''\geq \Delta R2''$.

Figure 29:
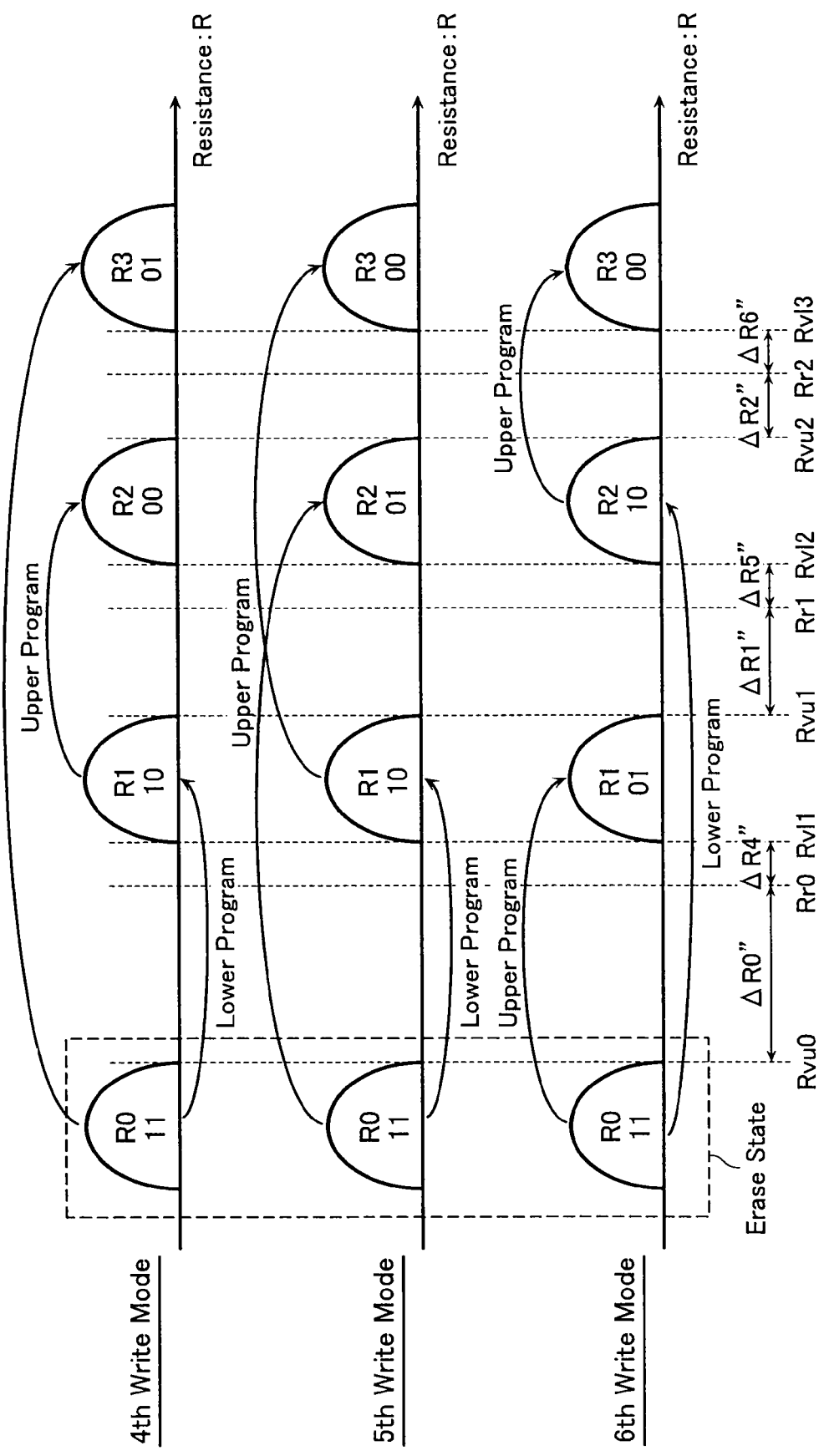
FIG. 29 shows fourth to sixth write modes, in which four-level data is adapted in such a way as: the low resistance state is defined as the erase state.

FIG. 29 shows fourth to sixth write modes, in each of which cells are set in a set state as an initial state, and then a reset operation including the lower page write (or program) and the upper page write (or program) is performed for writing four-level data. Here, "set" and "reset" are defined as "erase" and "write (or program)", respectively. The erase state (set state) with the lowest resistance value, R0, in four-level data is defined as "11".

In the fourth write mode, as the resistance values R1, R2 and R3 are increased in level in this order, data "10", "00" and "01" are bit-assigned to them, respectively. In detail, data "10" (resistance value R1) is written in the lower page write cycle; and then data "00" (resistance value R2) and data "01" (resistance value R3) are written from "10" and "11", respectively, in the upper page write cycle.

In the fifth write mode, as the resistance values R1, R2 and R3 are increased in level in this order, data "10", "01" and "00" are bit-assigned to them, respectively. In detail, data "10" (resistance value R1) is written in the lower page write cycle; and then data "01" (resistance value R2) and data "00" (resistance value R3) are written from "11" and "10", respectively, in the upper page write cycle.

In the sixth write mode, as the resistance values R1, R2 and R3 are increased in level in this order, data "01", "10" and "00" are bit-assigned to them, respectively. In detail, data "10" (resistance value R2) is written in the lower page write cycle; and then data "01" (resistance value R1) and data "00" (resistance value R3) are written from "11" and "10", respectively, in the upper page write cycle.

In the above-described fourth to sixth write modes, write-verify levels of the resistance values R1, R2 and R3 are the lower limit values Rv11, Rv12 and Rv13 of the resistance value distributions, respectively, and over-write-verify levels of the resistance values R0, R1 and R2 are Rvu0, Rvu1 and Rvu2, respectively. Assuming that read levels Rr0, Rr1 and Rr2 are set between the respective resistance values as defined in order from the lower side, in this embodiment, $\Delta R0''=Rr0-Rvu0$, $\Delta R1''=Rr1-Rvu1$ and $\Delta R2''=Rr2-Rvu2$ are set, as similar to that explained with reference to FIG. 10, to satisfy the relationship of: $\Delta R0''>\Delta R1''\geq \Delta R2''$.

With respect to $Rv11-Rr0=\Delta R4''$, $Rv12-Rr1=\Delta R5''$ and $Rv13-Rr2=\Delta R6''$, it will be set, for example, the following relationship of: $\Delta R4''=\Delta R5''=\Delta R6$.

Figure 30:
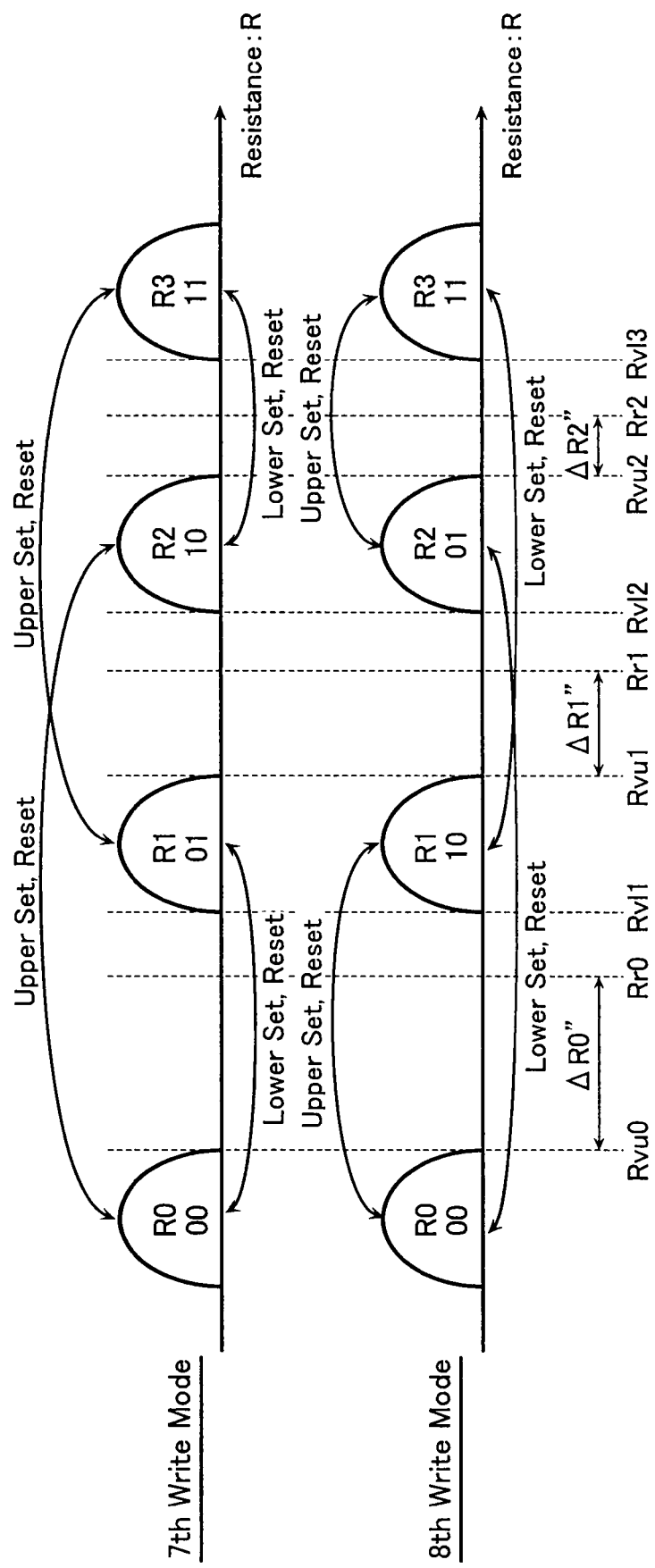
FIG. 30 shows seventh and eighth write modes, in which four-level data is set and reset by random accessing.

FIG. 30 shows seventh and eighth write modes, in each of which random-access data write is performed with "0"-write and "1"-write defined by "set" and "reset", respectively. In these cases, there is not used such a general scheme that erase in a lump is performed and then write is followed it as adapted to a conventional flash memory, but cells are set and reset in accordance with input data "0" and "1", respectively.

In the seventh write mode, four-level data is defined by R0="00", R1="01", R2="10" and R3="11" arranged in order from the lower resistance value side. In the lower page set and reset operation, reset from data "00" (resistance value R0) to data "01" (resistance value R1) and set reversed to it are performed; and reset from data "10" (resistance value R2) to data "11" (resistance value R3) and set reversed to it are performed. In the upper page set and reset operation, reset from data "00" (resistance value R0) to data "10" (resistance value R2) and set reversed to it are performed; and reset from data "01" (resistance value R1) to data "11" (resistance value R3) and set reversed to it are performed.

In the eighth write mode, four-level data is defined by R0="00", R1="10", R2="01" and R3="11" arranged in order from the lower resistance value side. In the lower page set and reset operation, reset from data "00" (resistance value R0) to data "01" (resistance value R2) and set reversed to it are performed; and reset from data "10" (resistance value R1) to data "11" (resistance value R3) and set reversed to it are performed. In the upper page set and reset operation, reset from data "00" (resistance value R0) to data "10" (resistance value R1) and set reversed to it are performed; and reset from data "01" (resistance value R2) to data "11" (resistance value R3) and set reversed to it are performed.

In these seventh and eighth write modes, write-verify levels of the resistance values R0, R1 and R2 are the upper limit values Rvu0, Rvu1 and Rvu2 of the resistance value distributions, respectively. Assuming that read levels Rr0, Rr1 and Rr2 are set between the respective resistance values as defined in order from the lower side, in this embodiment, $\Delta R0''=Rr0-Rvu0$, $\Delta R1''=Rr1-Rvu1$ and $\Delta R2''=Rr2-Rvu2$ are set, as similar to that explained with reference to FIG. 10, to satisfy the relationship of: $\Delta R0''>\Delta R1''\geq \Delta R2''$.

This invention is not limited to the above-described embodiment. It will be understood by those skilled in the art that various changes in form and detail may be made without departing from the spirit, scope, and teaching of the invention.

What is claimed is:

1. A resistance change memory device comprising memory cells arranged, the memory cell having a stable state with a high resistance value and storing in a non-volatile manner such multi-level data that at least three resistance values, R0, R1 and R2 (R0<R1<R2) are selectively set, wherein
resistance gaps $\Delta R1(=R1-R0)$ and $\Delta R2(=R2-R1)$ are set to satisfy the relationship of $\Delta R1>\Delta R2$.

2. The resistance change memory device according to claim 1, wherein
the memory cell is reset at the highest resistance value R3, and the resistance values R2, R1 and R0 are selectively set in it for storing four-level data, and wherein
resistance gap $\Delta R3(=R3-R2)$ is set to satisfy the relationship of $\Delta R1>\Delta R2\geq \Delta R3$.

3. The resistance change memory device according to claim 1, wherein
the memory cell is reset at the highest resistance value R3, and the resistance values R2, R1 and R0 are selectively set in it for storing four-level data, and wherein
read threshold values Rr1, Rr2 and Rr3 are set between the respective resistance values R0, R1, R2 and R3, and resistance gaps $\Delta R1'$, $\Delta R2'$ and $\Delta R3'$ defined between Rr1, Rr2 and Rr3 and the lower limit values of R1, R2 and R3, respectively, are set to satisfy the relationship of $\Delta R1'>\Delta R2'\geq \Delta R3'$.

4. The resistance change memory device according to claim 1, wherein
the memory cell is reset at the highest resistance value R3, and the resistance values R2, R1 and R0 are selectively set in it for storing four-level data, and wherein
read threshold values Rr1, Rr2 and Rr3 are set between the respective resistance values R0, R1, R2 and R3, and resistance gaps $\Delta R0''$, $\Delta R1''$ and $\Delta R2''$ defined between Rr1, Rr2 and Rr3 and the upper limit values of R0, R1 and R2, respectively, are set to satisfy the relationship of $\Delta R0''>\Delta R1''\geq \Delta R2''$.

5. The resistance change memory device according to claim 1, wherein the memory cell is reset at the highest resistance value R3, and the resistance values R2, R1 and R0 are selectively set in it for storing four-level data, and wherein resistance gap $\Delta R3$ defined between R2 and R3 is set to satisfy the relationship of $\Delta R3 > \Delta R2$.

6. The resistance change memory device according to claim 2, wherein the relationship of $\Delta R1/R1 > \Delta R2/R2 \geqq \Delta R3/R3$ is further satisfied.

7. The resistance change memory device according to claim 3, wherein the relationship of $\Delta R1'/Rr1 > \Delta R2'/Rr2 \geqq \Delta R3'/Rr3$ is further satisfied.

8. The resistance change memory device according to claim 4, wherein the relationship of $\Delta R0''/Rr0 > \Delta R1''/Rr1 \geqq \Delta R2''/Rr2$ is further satisfied.

9. The resistance change memory device according to claim 5, wherein the relationships of $\Delta R3/R3 > \Delta R2/R2$ and $\Delta R1/R1 > \Delta R2/R2$ are further satisfied.

10. The resistance change memory device according to claim 1, wherein the memory cells are three-dimensionally arranged on a semiconductor substrate.

11. A resistance change memory device comprising memory cells arranged, wherein the memory cell is reset at the lowest resistance value R0, and resistance values R1, R2 and R3 (R0<R1<R2<R3) are selectively set in it for storing four-level data in a non-volatile manner, the highest resistance value R3 being unstable, and wherein resistance gaps $\Delta R1(=R1-R0)$, $\Delta R2(=R2-R1)$ and $\Delta R3(=R3-R2)$ are set to satisfy the relationship of $\Delta R3 > \Delta R2 \geqq \Delta R1$.

12. The resistance change memory device according to claim 11, wherein assuming that read threshold values Rr1, Rr2 and Rr3 are set between the respective resistance values R0, R1, R2 and R3, respectively, and the lowest values of the resistance values R1, R2 and R3 are defined as Rv11, Rv12 and Rv13, respectively, resistance gaps $\Delta R1'(=Rv11-Rr1)$, $\Delta R2'(=Rv12-Rr2)$ and $\Delta R3'(Rv13-Rr3)$ are set to satisfy the relationship of $\Delta R3' > \Delta R2' \geqq \Delta R1'$.

13. The resistance change memory device according to claim 11, wherein assuming that read threshold values Rr0, Rr1 and Rr2 are set between the respective resistance values R0, R1, R2 and R3, respectively, and the highest values of the resistance values R0, R1 and R2 are defined as Rvu0, Rvu1 and Rvu2, respectively, resistance gaps $\Delta R0''(=Rr0-Rvu0)$, $\Delta R1''(=Rr1-Rvu1)$ and $\Delta R2''(=Rr2-Rvu2)$ are set to satisfy the relationship of $\Delta R2'' > \Delta R1'' \geqq \Delta R0''$.

14. The resistance change memory device according to claim 11, wherein the memory cells are three-dimensionally arranged on a semiconductor substrate.

* * * * *